United States Patent
Kiesel et al.

(10) Patent No.: US 12,199,711 B2
(45) Date of Patent: Jan. 14, 2025

(54) ANTENNA SYSTEM HAVING SIMULTANEOUS BEAMFORMING AND SURVEYING CAPABILITY

(71) Applicant: Viasat Inc., Carlsbad, CA (US)

(72) Inventors: Gregory Kiesel, Marietta, GA (US); Christopher A. Rose, Braselton, GA (US); David R. Saunders, Scottdale, AZ (US)

(73) Assignee: Viasat, Inc., Carlsbad, CA (US)

( * ) Notice: Subject to any disclaimer, the term of this patent is extended or adjusted under 35 U.S.C. 154(b) by 30 days.

(21) Appl. No.: 18/009,448

(22) PCT Filed: Jun. 9, 2021

(86) PCT No.: PCT/US2021/036640
§ 371 (c)(1),
(2) Date: Dec. 9, 2022

(87) PCT Pub. No.: WO2021/252646
PCT Pub. Date: Dec. 16, 2021

(65) Prior Publication Data
US 2023/0239023 A1    Jul. 27, 2023

Related U.S. Application Data

(60) Provisional application No. 63/037,842, filed on Jun. 11, 2020.

(51) Int. Cl.
*H04B 7/06* (2006.01)
*H03M 1/12* (2006.01)
*H04B 7/08* (2006.01)

(52) U.S. Cl.
CPC ........... *H04B 7/0617* (2013.01); *H03M 1/12* (2013.01); *H04B 7/0691* (2013.01); *H04B 7/086* (2013.01)

(58) Field of Classification Search
None
See application file for complete search history.

(56) References Cited

U.S. PATENT DOCUMENTS

| 7,830,982 | B2 | 11/2010 | Mesecher | |
| 10,177,451 | B1 * | 1/2019 | Baraban | H04B 1/1027 |
| 11,677,145 | B1 * | 6/2023 | Sharma | H01Q 3/2682 |
| | | | | 342/372 |
| 2009/0231197 | A1 | 9/2009 | Richards | |
| 2017/0026205 | A1 | 1/2017 | Agee | |

(Continued)

OTHER PUBLICATIONS

International Search Report and Written Opinion, PCT/US2021/036640 dated Nov. 12, 2021, 22 pages.

*Primary Examiner* — Marcus Smith
(74) *Attorney, Agent, or Firm* — Holland & Hart LLP

(57) ABSTRACT

An apparatus as described herein may include an antenna array that receives radio frequency signals and outputs analog signals. The apparatus may also include analog to digital signal converters that convert the analog signals into digital sample streams. Also, the apparatus may include a sample buffer that buffers subsets of the digital sample streams and a beamformer that uses the digital sample streams to generate one or more beam signals. Additionally, the apparatus may include a processor that determines a spatial characteristic or a spectral characteristic for the radio frequency signals based on the subsets of the digital sample streams.

31 Claims, 9 Drawing Sheets

(56) References Cited

U.S. PATENT DOCUMENTS

2017/0302357 A1* 10/2017 Lyu ...................... H04B 7/0617
2017/0324440 A1* 11/2017 Snow ....................... H04B 1/66
2019/0058530 A1    2/2019 Rainish et al.

* cited by examiner

ANTENNA SYSTEM HAVING SIMULTANEOUS BEAMFORMING AND SURVEYING CAPABILITY

CROSS REFERENCE

The present application for patent is a 371 national phase filing of International Patent Application No. PCT/US2021/036640 by KIESEL et al., entitled "ANTENNA SYSTEM HAVING SIMULTANEOUS BEAMFORMING AND SURVEYING CAPABILITY" filed Jun. 9, 2021, which claims the benefit of U.S. Provisional Patent Application No. 63/037,842 by KIESEL et al., entitled "ANTENNA SYSTEM HAVING SIMULTANEOUS BEAMFORMING AND SURVEYING CAPABILITY," filed Jun. 11, 2020, each of which is assigned to the assignee hereof, and each of which is expressly incorporated by reference in its entirety herein.

BACKGROUND

The following relates generally to communications and more specifically to digital beamforming antennas.

A communications device in a communications system may receive multiple signals that arrive from multiple directions. Beamforming techniques may be used to obtain one or more beam signals from a composite signal received at a communications device, where the beam signals may be associated with separate signals transmitted from one or more devices to the communications device.

SUMMARY

The described techniques relate to improved methods, systems, devices, and apparatuses that support simultaneous beamforming and surveying modes. An apparatus may include an antenna array that receives radio frequency signals and outputs analog signals. The apparatus may also include analog-to-digital signal converters that convert the analog signals into digital sample streams. Also, the apparatus may include a sample buffer that buffers subsets of the digital sample streams and a beamformer that uses the digital sample streams to generate one or more beam signals. In some examples, the beamformer combines (e.g., in an irreversible manner; for example, by summing portions of the digital sample streams) the samples of the digital sample streams during the generation of the one or more beam signals. In some examples, the sample buffer stores subsets of the digital sample streams, which may enable the subsets of the digital sample streams to be preserved for additional processing.

The apparatus may also include a stream processor (which may include a network of distributed stream processors) that manages the communication of the one or more beam signals and the subsets of the digital sample streams within a receiving device. For example, the stream processor may be configured to deliver the one or more beam signals and the subsets of the digital sample streams from a distributed network of sample buffers and beamformers to a processor of the apparatus. In some examples, the stream processor is configured to transmit the one or more beam signals and subsets of the digital sample streams over a communications interface in an interleaved fashion. The processor may determine a spatial characteristic or a spectral characteristic for the radio frequency signals based on the subsets of the digital sample streams.

BRIEF DESCRIPTION OF THE DRAWINGS

FIGS. 2 through 6A show receiving devices that support simultaneous beamforming and surveying modes in accordance with examples as disclosed herein.

DETAILED DESCRIPTION

Figure 1A:
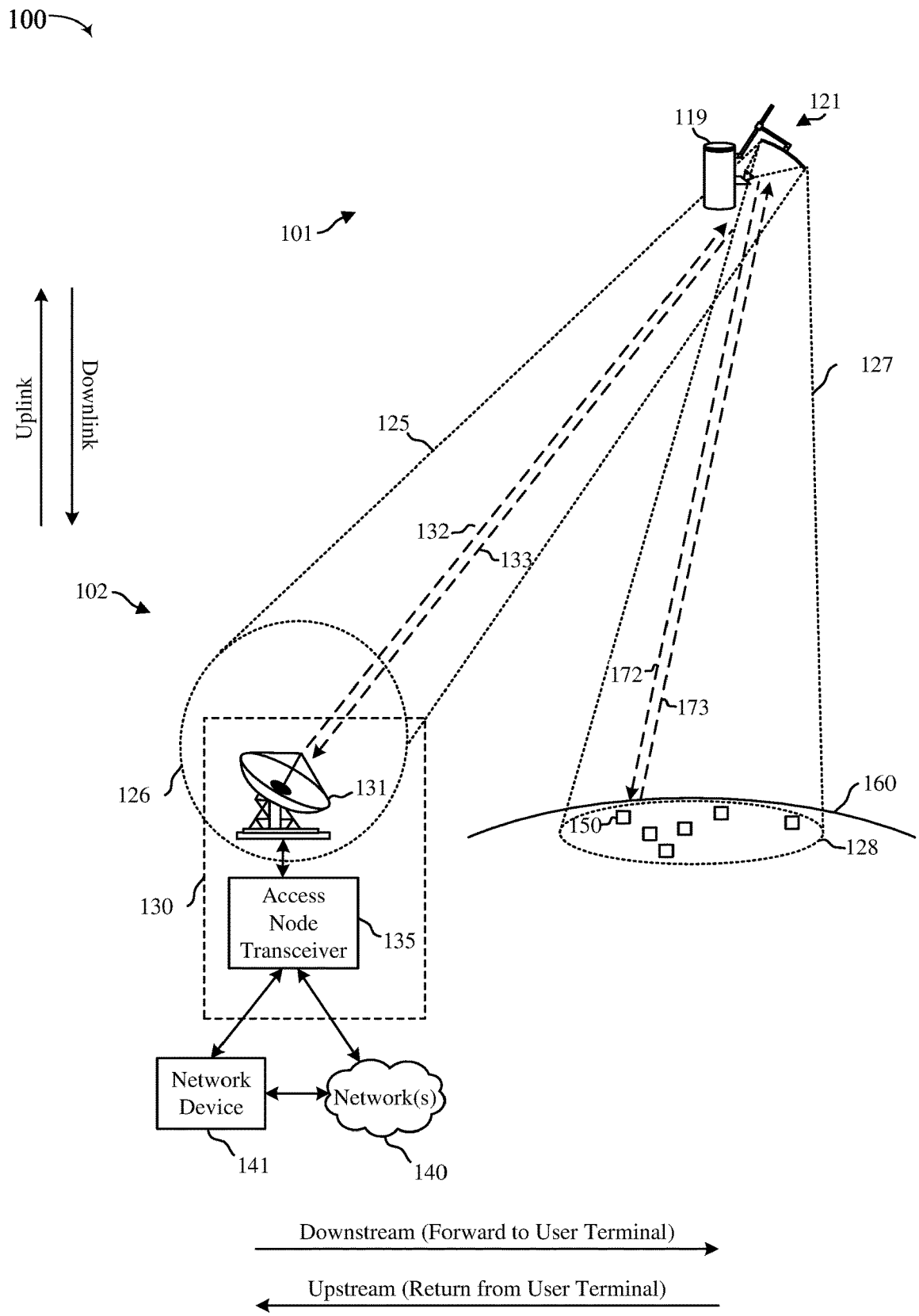
FIG. 1A shows a diagram of a satellite communications system in accordance with examples as disclosed herein.

An (sometimes referred to herein as a "receiving device") may receive a radio frequency signal with an antenna array that includes multiple antenna elements. In some examples, the radio frequency signal may include one or more communication signals transmitted from multiple devices that are positioned within a field of view of the s receiving device. In some examples, a receiving device may use beamforming techniques to obtain the one or more communication signals received in the radio frequency signal, where the one or more communication signals may correspond to signals carrying information that were intentionally or unintentionally transmitted to the receiving device from one or more other devices. To obtain the one or more communication signals the receiving device may form a first beam in a first direction by applying a first set of beam weights to a set of digital sample streams received from a first set of antennas and may form a second beam in a second direction by applying a second set of beam weights to the set of digital sample streams. The receiving device may use the first beam to obtain a first beam signal from the radio frequency signal and the second beam to obtain a second beam signal from the radio frequency signal and so forth. The receiving device may process (e.g., demodulate, decode) the first beam signal and the second beam signal, and any additional beam signals, to obtain the one or more signals.

In some examples, a receiving device may use surveying techniques to identify spatial characteristics about an area within the field of view of the receiving device (e.g., a position of other devices, including communication devices, interfering communication devices, and otherwise). The receiving device may also or alternatively use the surveying techniques to determine spectral characteristics about the area within the field of view of the receiving device (e.g., frequency information, phase information, etc.) for the signals transmitted by the other devices. Both beamforming and surveying techniques may involve processing a digitized data stream obtained from each of the antenna elements (and/or groups of antenna elements) in the antenna array.

As the number of antenna elements supported by a receiving device increases, so too may the amount of data generated from the antenna elements. In some examples, the amount of generated data exceeds a bandwidth of a communication interface that communicatively couples a main processor to the antenna elements which may prevent the real-time processing of the generated data by a single computing node or processor. To support real-time processing of the data generated from a large quantity of antenna elements (e.g., for beamforming), a receiving device may include distributed processing components (e.g., beamformers) that support processing subsets of the generated data. In some examples, each beamformer may generate data at a lower data rate than a data rate of data received at the beamformer. Since distributed beamforming techniques disperse the information associated with the digital sample streams across the beamformers and convert the multiple digital sample streams into beam signals with information loss, performing a surveying operation with a distributed beamforming antenna architecture may present challenges.

To enable simultaneous beamforming and surveying modes of operation, a receiving device may be configured to preserve subsets of digital sample streams generated by a large quantity of antenna elements and to support techniques for signaling the subsets of the digital sample streams to a main processor while concurrently supporting the generation of beam signals. In some examples, a receiving device may include an antenna array that includes multiple antenna elements (e.g., hundreds or thousands of antenna elements). In some cases, the antenna elements may be grouped into antenna element groups. Each antenna element group may be coupled with a group of ADCs that are configured to convert analog signals output by antennas of the antenna element group into respective digital sample streams. In some examples, each ADC may be coupled with one or more of the antenna elements in a respective antenna element group.

Each group of ADCs may output the digital sample streams to a respective element combiner that is configured to process the digital sample streams. An element combiner may include an element beamformer, an element sample buffer, and an element stream processor. The element beamformer may be used to apply one or more sets of beam weights to digital sample streams received from a respective group of ADCs and to sum the weighted digital sample streams together to obtain one or more subarray signals. The element sample buffer may buffer subsets of the digital sample streams for subsequent survey operations—e.g., periodically or after receiving a trigger. In some examples, the aspects of the element sample buffers across multiple element combiners may buffer time-synchronized subsets of digital sample streams received from respective groups of ADCs.

In some examples, the element combiners may be arranged in a daisy-chain configuration. In such cases, an element combiner in a leading position of the daisy-chain may pass (e.g., using an element stream processor) one or more subarray signals and subsets of digital sample streams buffered in an element sample buffer at the element combiner to an adjacent element combiner. The adjacent element combiner may combine (e.g., using an element stream processor) the one or more received subarray signals with one or more subarray signals generated at the adjacent element combiner. The adjacent element combiner may also collate (e.g., using the element stream processor) the received subsets of digital sample streams with time-synchronized subsets of digital sample streams communicated from the adjacent element combiner. Each element combiner may send the combined subarray signals and collated subsets of digital sample streams to the next element combiner in the daisy-chain configuration—e.g., in an interleaved fashion. In some examples, the last element combiner in the daisy-chain may send one or more beam signals and the collated subsets of the digital sample streams to a main processor—e.g., in an interleaved fashion. In some examples, the element sample buffers may be locally processed and spatial and/or spectral information may be sent to a main processor. In some examples, the element sample buffers may be locally processed and spatial and/or spectral information may be incrementally processed along the daisy-chain.

In some examples, the element combiners may be arranged in a corporate-feed configuration. In such cases, multiple element combiners may be coupled with a subarray combiner. A subarray combiner may include a subarray beamformer and a subarray stream processor. The subarray beamformer may be used to combine subarray signals received from a respective set of element combiners to obtain one or more beam signals. The subarray stream processor may be used to collate time-synchronized subsets of digital sample streams received from the respective set of element combiners. The subarray stream processor may also be used to transmit the one or more beam signals and collated time-synchronized subsets of digital sample streams to a main processor—e.g., in an interleaved fashion. Although a two-level corporate-feed configuration is described (element combiners and a subarray combiner), additional levels of the corporate-feed configuration may be used (e.g., with additional levels of subarray combiners). Additionally, or alternatively, a combination of daisy-chain and corporate-feed configurations may be used, with element combiners or subarray combiners connected in either a daisy-chain or corporate-feed configuration. In some examples, the element sample buffers may be locally processed and spatial and/or spectral information may be sent to a main processor. In some examples, the element sample buffers may be locally processed and spatial and/or spectral information may be incrementally processed along the corporate structure. In some examples, the element sample buffers may be locally processed and spatial and/or spectral data may be incrementally processed along a hybrid daisy-chain and corporate structure.

By using a distributed beamforming and surveying architecture, a complexity of a device that supports simultaneous beamforming and surveying modes may be reduced and larger amounts of data may be managed. Also, by storing subsets of digital sample streams to support the surveying mode, an amount of data instantaneously transmitted to support a simultaneous beamforming and surveying mode may be reduced.

FIG. 1A shows a diagram of a satellite communications system that supports simultaneous beamforming and surveying modes in accordance with examples as disclosed herein. Communications system 100 may use a number of network architectures including a space segment 101 and ground segment 102. The space segment 101 may include one or more satellites 119. The ground segment 102 may include one or more access node terminals 130 (e.g., gateway terminals, ground stations), as well as network devices 141 such as network operations centers (NOCs), satellite and gateway terminal command centers, or other central processing centers or devices. Network device(s) 141 may be coupled with the access node terminal 130 and may control aspects of the communications system 100. In various examples a network device 141 may be co-located or otherwise nearby the access node terminal 130 or may be a remote installation that communicates with the access node terminal 130 and/or network(s) 140 via wired and/or wireless communications link(s). In some examples, the ground segment 102 may also include user terminals 150 that are provided a communications service via a satellite 119.

User terminals 150 may include various devices configured to communicate signals with the satellite 119, which may include fixed terminals (e.g., ground-based stationary terminals) or mobile terminals such as terminals on boats, aircraft, ground-based vehicles, and the like. A user terminal 150 may communicate data and information with an access node terminal 130 via the satellite 119. The data and information may be communicated with a destination device such as a network device 141, or some other device or distributed server associated with a network 140.

An access node terminal 130 may transmit forward uplink signals 132 to satellite 119 and receive return downlink signals 133 from satellite 119. Access node terminals 130 may also be known as ground stations, gateways, gateway terminals, or hubs. An access node terminal 130 may include an access node terminal antenna system 131 and an access node terminal transceiver 135. The access node terminal antenna system 131 may be two-way capable and designed with adequate transmit power and receive sensitivity to communicate reliably with the satellite 119. In some examples, access node terminal antenna system 131 may comprise a parabolic reflector with high directivity in the direction of a satellite 119 and low directivity in other directions. Access node terminal antenna system 131 may comprise a variety of alternative configurations and include operating features such as high isolation between orthogonal polarizations, high efficiency in the operational frequency bands, low noise, and the like.

When supporting a communications service, an access node terminal 130 may schedule traffic to user terminals 150. Alternatively, such scheduling may be performed in other parts of a communications system 100 (e.g., at one or more network devices 141, which may include network operations centers (NOC) and/or gateway command centers). Although one access node terminal 130 is shown in FIG. 1, examples in accordance with the present disclosure may be implemented in communications systems having a plurality of access node terminals 130, each of which may be coupled to each other and/or one or more networks 140.

An access node terminal 130 may provide an interface between the network 140 and the satellite 119 and, in some examples, may be configured to receive data and information directed between the network 140 and one or more user terminals 150. Access node terminal 130 may format the data and information for delivery to respective user terminals 150. Similarly, access node terminal 130 may be configured to receive signals from the satellite 119 (e.g., from one or more user terminals 150) directed to a destination accessible via network 140. Access node terminal 130 may also format the received signals for transmission on network 140.

The network(s) 140 may be any type of network and can include, for example, the Internet, an internet protocol (IP) network, an intranet, a wide-area network (WAN), a metropolitan area network (MAN), a local-area network (LAN), a virtual private network (VPN), a virtual LAN (VLAN), a fiber optic network, a hybrid fiber-coax network, a cable network, a public switched telephone network (PSTN), a public switched data network (PSDN), a public land mobile network, and/or any other type of network supporting communications between devices as described herein. Network (s) 140 may include both wired and wireless connections as well as optical links. Network(s) 140 may connect the access node terminal 130 with other access node terminals that may be in communication with the same satellite 119 or with different satellites 119 or other vehicles.

A satellite 119 may be configured to support wireless communications between one or more access node terminals 130 and/or various user terminals 150 located in a service coverage area. In some examples, the satellite 119 may be deployed in a geostationary orbit, such that its orbital position with respect to terrestrial devices is relatively fixed or fixed within an operational tolerance or other orbital window (e.g., within an orbital slot). In other examples, the satellite 119 may operate in any appropriate orbit (e.g., low Earth orbit (LEO), medium Earth orbit (MEO), etc.).

The satellite 120 may include an antenna assembly 121 having one or more antenna feed elements. Each of the antenna feed elements may include, for example, a feed horn, a polarization transducer (e.g., a septum polarized horn, which may function as two combined elements with different polarizations), a multi-port multi-band horn (e.g., dual-band 20 GHz/30 GHz with dual polarization LHCP/RHCP), a cavity-backed slot, an inverted-F, a slotted waveguide, a Vivaldi, a Helical, a loop, a patch, or any other configuration of an antenna element or combination of interconnected sub-elements. Each of the antenna feed elements may also include, or be otherwise coupled with, a radio frequency (RF) signal transducer, a low noise amplifier (LNA), or power amplifier (PA), and may be coupled with one or more transponders in the satellite 120. The transponders may be used to perform signal processing, such as amplification, frequency conversion, beamforming, and the like.

When supporting a communications service, the satellite 119 may receive forward uplink signals 132 from one or more access node terminals 130 and provide corresponding forward downlink signals 172 to one or more user terminals 150. The satellite 119 may also receive return uplink signals 173 from one or more user terminals 150 and provide corresponding return downlink signals 133 to one or more access node terminals 130. A variety of physical layer transmission modulation and coding techniques may be used by access node terminals 130, satellite 119, and user terminals 150 for the communication of signals (e.g., adaptive coding and modulation (ACM)). A satellite 119 may include one or more transponders that may each be coupled with one or more receive elements and one or more transmit antenna elements of an antenna.

The satellite 119 may communicate with an access node terminal 130 by transmitting return downlink signals 133 and/or receiving forward uplink signals 132 via one or more access node terminal beams (e.g., access node beam 125, which may be associated with a respective access node beam coverage area 126). Access node beam 125 may, for example, support a communications service for one or more user terminals 150 (e.g., relayed by the satellite 119), or any other communications between the satellite 119 and the access node terminal 130. In some examples, access node beam 125 is one of multiple spot beams. The satellite 119 may communicate with a user terminal 150 by transmitting forward downlink signals 172 and/or receiving return uplink signals 173 via one or more user beams (e.g., user beam 127, which may be associated with a respective user beam coverage area 128). User beam 127 may support a communications service for one or more user terminals 150 or any other communications between the satellite 119 and the user terminal 150. In some examples, user beam 127 is one of multiple spot beams. In some examples, the satellite 119 may relay communications from an access node terminal 130 to user terminals 150 using one of the access node beam 125 or the user beam 127 (that is, access node terminals 130 and user terminals 150 may share a beam).

A receiving device (e.g., an access node terminal 130, satellite 119, or user terminal 150) may use beamforming techniques as described herein to receive simultaneous communications from multiple transmitting devices (e.g., multiple access node terminals 130, satellites 119, or user terminals 150). The phrase "receiving device" as used herein refers to a device configured to receives signals, but that device may also in some examples be configured to transmit signals. In other words, the phrase "receiving device" is open-ended and does not necessarily mean the device is receive-only. The communications received from the different transmitting devices at the receiving device may have different angles of arrival. A receiving device may receive a composite signal that includes the communications from the different transmitting devices and may use beamforming techniques to separate the communications from the different transmitting devices into corresponding beam signals. That is, the communications received at the receiving device may be received over different beams (from a same or different devices), and the receiving device may use beamforming techniques to separate the different communications into separate beam signals. Separating the different communications may involve applying multiple sets of beam weights (which may be referred to using the symbol $\overline{w}_i$) to a signal received at the receiving device, where the received signal may include multiple spatial components. For example, applying a first set of beam weights to the received signal may result in a first beam signal that corresponds to a transmission from a first transmitting device being generated. And applying a second set of beam weights to the received signal may result in a second beam signal that corresponds to a transmission from a second transmitting device being generated.

To support beamforming techniques, the receiving device may be configured with an antenna array that includes multiple antenna elements. In some examples, subsets of the antenna elements are grouped together to form subarrays. To separate spatial components of a received signal, the receiving device may process signals received at each antenna element of the antenna array, applying beam weights to the received signals and combining the weighted received signals to obtain multiple beam signals. In some examples, the receiving device includes analog-to-digital signal converters (which may be referred to as ADCs) between the antenna elements and a processor that is configured to perform beamforming. The ADCs may be used to convert analog signals obtained at the antenna elements into digital sample streams. The processor may apply one or more sets of beam weights to the digital sample streams to obtain one or more beam signals.

In some examples, a receiving device is equipped with a large number of antenna elements (e.g., hundreds). In some cases, each antenna element may be coupled with a respective ADC. Additionally, or alternatively, groups of antenna elements may be coupled with a respective ADC. Analog beamforming may be applied within a group of antenna elements, in some cases. In either case, the receiving device may use the ADCs to generate a large number of digital sample streams (e.g., hundreds) from the analog signals received from the corresponding antenna elements (or groups of antenna elements). In some examples, to process the large amount of data generated by the ADCs, a distributed beamformer may be used that includes beamformers that support processing the digital sample streams of subsets of the ADCs. In some examples, the distributed beamformer may include first-level beamformers (which may be referred to as element beamformers) that are configured to generate one or more beam signals based on digital signals obtained from a group of antenna elements. In some examples, the beam signals generated by the first-level beamformers are referred to as subarray signals. The distributed beamformer may also include second-level beamformers (which may be referred to as subarray beamformers) that are configured to combine the one or more subarray signals generated by the first-level beamformers to obtain one or more beam signals. Additional levels of beamformers may be used, depending on the size of the antenna array and number of digital sample streams processed by each beamformer.

After a digital sample stream is processed by a beamformer to obtain one or more beam signals, the original data from the digital sample stream may be lost or discarded. That is, a beamformer necessarily removes spatial information present in multiple digital sample streams by extracting information associated with a particular receive direction, while information associated with other directions is diminished. In some examples, communication interfaces of the receiving device may be unable to support (e.g., may not have the bandwidth to transfer) the communication of the digital sample streams to a single beamforming processor. In addition, it may not be feasible to implement beamforming for a high number of digital sample streams in a single beamforming processor (e.g., a single computing node). For example, for high bandwidth communications each digital sample stream may have a sample rate in excess of 1 Giga-sample (Gs) per second (s), and thus the bandwidth for more than a relatively small number (e.g., dozens) of digital sample streams may be in excess of available communication interfaces or beamforming processors. Thus, a distributed beamforming architecture may apply beamforming locally to groups of antenna elements to reduce signal bandwidth and processing power for each beamformer stage.

Survey techniques may be used to learn information about signals from other transmitting devices. The survey techniques may be used to determine spatial information (e.g., a direction of transmitting devices relative to the receiving device) and/or spectral information (e.g., carrier frequencies of signals received from transmitting devices). To determine the spatial and/or spectral information, the receiving device may process stored signals associated with multiple antenna elements using signal processing techniques (e.g., eigenvector techniques, FFT techniques, super resolution techniques, etc.). In some examples, the receiving device may generate a map of detected signals as a function of frequency or direction. In some examples, the receiving device generates a map of detected signals as a function of both frequency and direction. These detected signals may be passed directly the main processor or incrementally processed by a distribution network of processors.

As the number of antenna elements supported by a receiving device increases, so to may the amount of data generated from the antenna elements. In some examples, the amount of generated data exceeds a bandwidth of a communication interface that communicatively couples a main processor to the antenna elements which may prevent the real-time processing of the generated data by a single computing node or processor. To support real-time processing of the data generated from a large quantity of antenna elements (e.g., for beamforming), a receiving device may include distributed processing components (e.g., beamformers) that support processing subsets of the generated data. In some examples, each beamformer may generate data at a lower date rate than a data rate of data received at the beamformer. Since distributed beamforming techniques disperse the information associated with the digital sample streams across the beamformers and convert the multiple digital sample streams into beam signals with information loss, performing a surveying operation with a distributed beamforming operation may present challenges.

To enable simultaneous beamforming and surveying modes of operation, a receiving device (e.g., a satellite 119, an access node terminal 130, or user terminal 150), may be configured to preserve subsets of digital sample streams generated by a large quantity of antenna elements and to support techniques for signaling the subsets of the digital sample streams and generated beam signals to a main processor. In some examples, a receiving device may include an antenna array that includes multiple antenna elements (e.g., hundreds or thousands of antenna elements). In some cases, the antenna elements may be grouped into antenna element groups. Each antenna element group may be coupled with a group of ADCs that are configured to convert analog signals output by antennas of the antenna element group into digital sample streams. In some examples, each ADC may be coupled with one or more of the antenna elements in a respective antenna element group.

Figure 1B:
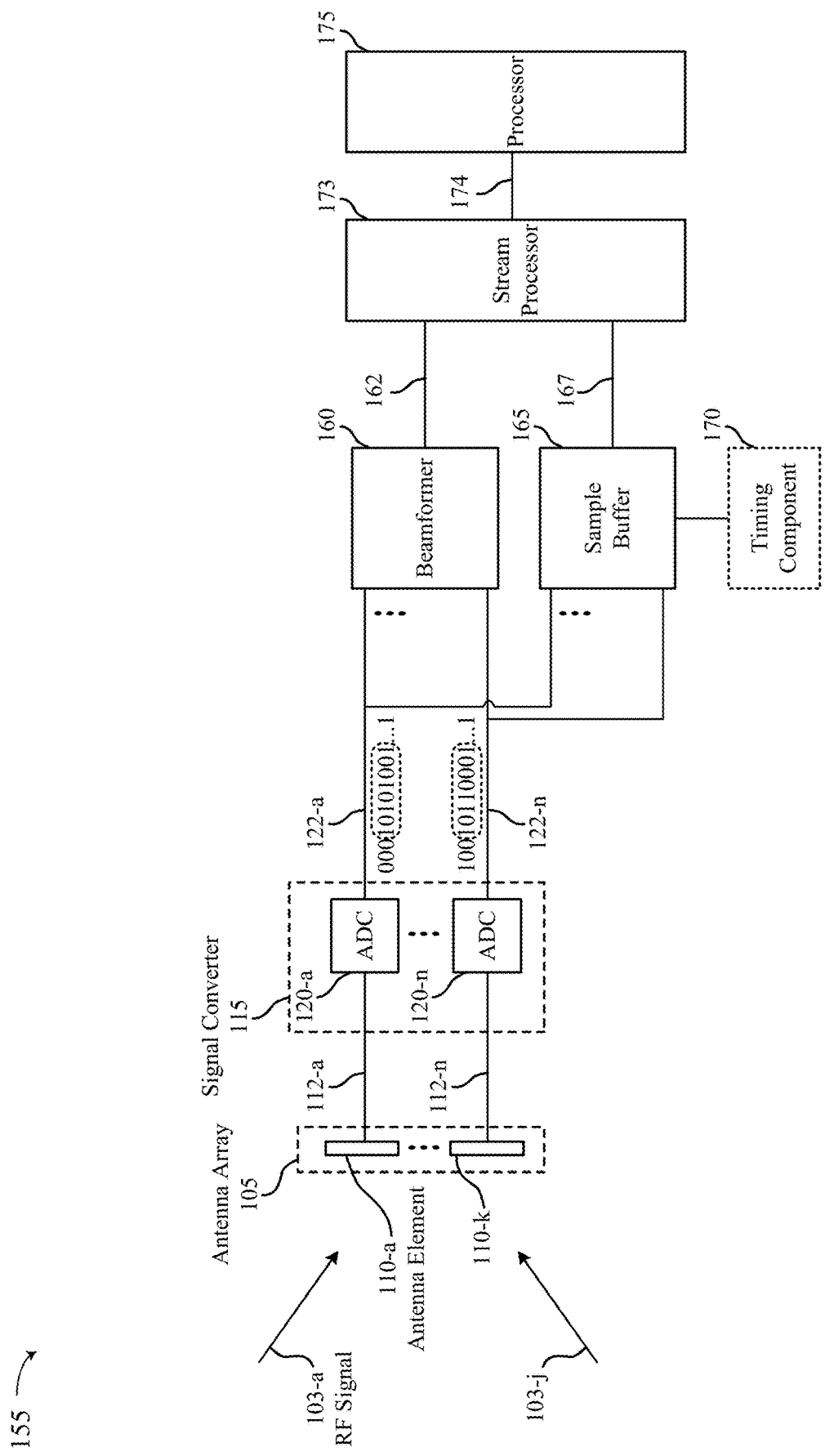
FIG. 1B shows a receiving device that supports simultaneous beamforming and surveying mode in accordance with examples as disclosed herein.

FIG. 1B shows a receiving device that supports simultaneous beamforming and surveying mode in accordance with examples as disclosed herein. Receiving device 155 may be configured to receive one or more signals from one or more transmitting devices (e.g., simultaneously). Receiving device 155 may be an access node terminal, a satellite, or a user terminal of a satellite communication system as described herein and with reference to FIG. 1. Alternatively, receiving device 155 may be employed in wireless systems other than satellite communication systems. Receiving device 155 may include antenna array 105, signal converter 115, beamformer 160, sample buffer 165, timing component 170, and processor 175.

Antenna array 105 may include multiple antenna elements (e.g., hundreds or thousands of antenna elements), including first antenna element 110-*a* and Kth antenna element 110-*k*. Antenna elements 110 may be configured in a tiled (e.g., two-dimensional) array in antenna array 105. Antenna array 105 may be configured to receive RF signals (e.g., RF signals 103) incident to receiving device 155. Receiving the RF signals may include converting RF energy captured at the antenna array into analog signals. The antenna elements in antenna array 105 may each be configured to convert RF energy captured at a respective antenna element into respective analog signals 112. In some examples, the RF signals received at multiple antenna elements are combined (e.g., passively or actively) before being passed to a next component in receiving device 155. The analog signals 112 generated at the different antenna elements 110 may be different from one another based on a position of the antenna element, an angle of arrival of RF signals 103 being detected at the antenna elements, an orientation of the antenna element, and the like. In some examples, the differences in the analog signals 112 generated by the different antenna elements 110 may be associated with a spatial component of a composite signal received at antenna array 105, where a composite signal may be a signal that includes multiple signals transmitted from multiple devices. Spatial components of the composite signal may be used to obtain the different signals received in a composite signal from one another—e.g., by forming beams in directions that correspond to directions of arrival for signals included in the composite signal. In some examples, an antenna element depicted in FIG. 1 may encompass multiple antenna elements of antenna array 105.

Signal converter 115 may include ADCs 120, including first ADC 120-*a* and Nth ADC 120-*n*. Signal converter 115 may be configured to convert analog signals 112 received from antenna array 105 to digital signals. Signal converter 115 may also perform other functions such as amplification or filtering. In some examples, the digital signals include streams of discrete samples of the analog signals and are referred to as digital sample streams 122. First ADC 120-*a* may be configured to receive first analog signal 112-*a* from first antenna element 110-*a* and to convert first analog signal 112-*a* into first digital sample stream 122-*a* that includes consecutive samples of first analog signal 112-*a* (e.g., a continuous stream of digital samples). Similarly, Nth ADC 120-*n* may be configured to receive Nth analog signal 112-*n* from Kth antenna element 110-*k*. In some examples, an ADC 120 may be configured to convert an analog signal 112 received from multiple antenna elements 110 (e.g., a combined analog signal) to a digital sample stream 122. K may be equal to or greater than N.

Beamformer 160 may be configured to apply beamforming weights to the digital sample streams 122 to obtain one or more beam signals 162, which may be based on the received RF signals 103. Beamformer 160 may send the one or more beam signals 162 to processor 175. In some examples, beamformer 160 is distributed across the signal processing system in receiving device 155. For example, beamformer 160 may include one or more element beamformers that are coupled with corresponding sets of ADCs 120. Beamformer 160 may also include one or more sub-array beamformers that are coupled with the one or more element beamformers.

In some examples, beamformer 160 may include weighting circuits (e.g., multipliers, phase shifters) and one or more summers (e.g., adders). In some examples, the weighting circuits may apply respective weights to respective digital sample streams 122 and the one or more summers may add together respective subsets of the weighted signals output by the multipliers. In some examples, the multipliers and summers may be implemented in an application-specific integrated circuit (ASIC), field programmable gate array (FPGA), or digital signal processor (DSP).

Sample buffer 165 may be configured to obtain subsets of the digital sample streams 122. The subsets of the digital sample streams 122 may include portions of the digital samples included in the digital sample streams 122. Sample buffer 165 may temporarily store the subsets of the digital sample streams 122. In some examples, sample buffer 165 may be distributed across the signal processing system in receiving device 155. For example, sample buffer 165 may include one or more element sample buffers that are coupled with corresponding sets of ADCs 120. Sample buffer 165 may also collate the subsets of the digital sample streams 122 (e.g., from other sample buffers 165) to obtain collated subsets 167 before sending collated subsets 167 of the digital sample streams 122 to processor 175. Sample buffer 165 may also process the samples to extract spatial and/or spectral information to be passed to the stream processor.

In some examples, sample buffer 165 may include embedded or attached memory (e.g., a cache or DRAM). The embedded or attached memory may be configured to store data when a timing signal (e.g., from timing component 170) is received. In some examples, the embedded or attached memory is coupled with circuitry for registering and writing samples of the subset of the digital sample stream to the attached memory. the circuitry may be implemented in an ASIC, FPGA, or DSP. The circuitry may receive the digital sample streams 122 and latch portions of a subset of the digital sample streams after receiving the timing signal. After the one or more registers capture the portions of the subset of the digital sample streams, a controller in the embedded or attached memory may be configured to write the portions of the subset of the digital sample streams to the attached memory.

Timing component 170 may be configured to trigger a sampling operation at sample buffer 165. For example, timing component 170 may send a timing signal to sample buffer 165 that causes sample buffer 165 to obtain digital samples in digital sample streams 122 for a period of time (e.g., to store a subset of the digital samples). Thus, timing component 170 may trigger sample buffer 165 to store (e.g., buffer) time-synchronized (e.g., with other sample buffers) subsets of the digital sample streams 122. In some examples, timing component 170 may include a clock. Timing component 170 may also include logic (e.g., programmable logic) that is coupled with the clock and used to generate a timing signal with a desired periodicity.

Stream processor 173 may be configured to send a digital stream of data that may or may not be packetized to processor 175. The digital stream may use synchronization pulses or sequences to align the data streams. Stream processor 173 may be configured to packetize beam signals 162 received from beamformer 160 and collated subsets 167 of digital sample streams 122. For example, stream processor 173 may be configured to generate one or more first packets based on beam signals 162 and one or more second packets based on collated subsets 167. Stream processor 173 may also be configured to interleave the first packets and the second packets to obtain combined packet stream 174. In some examples, stream processor 173 may include a first module for packetizing beam signals 162, a second module for packetizing collated subsets 167, and a third module for interleaving the first and second packets to obtain combined packet stream 174. In some examples, collated subsets 167 may be provided in a polled manner, rather than streamed. In some examples, the modules in stream processor generate packets in accordance with a communication protocol supported by processor 175. The first module, the second module, and the third module may be implemented in an ASIC, FPGA, or DSP.

Processor 175 may be configured to process beam signals 162 and collated subsets 167 of digital sample streams 122 received from stream processor 173 in combined packet stream 174. In some examples, processor 175 is configured to demodulate and decode beam signals 162 to obtain data embedded in RF signals 103. Processor 175 may also be configured to process the collated subsets 167 of digital sample streams 122 to determine spatial characteristics for the RF signals 103 (e.g., an angle of arrival) or spectral characteristics for the RF signals (e.g., a frequency range used), or both. Processor 175 may also be configured to process the collated subsets 167 of digital sample streams 122 to combine spatial characteristics of the RF signals 103 (e.g., an angle of arrival) or spectral characteristics for the RF signals 103 (e.g., a frequency range used), or both, from other instances of 165.

Figure 2:
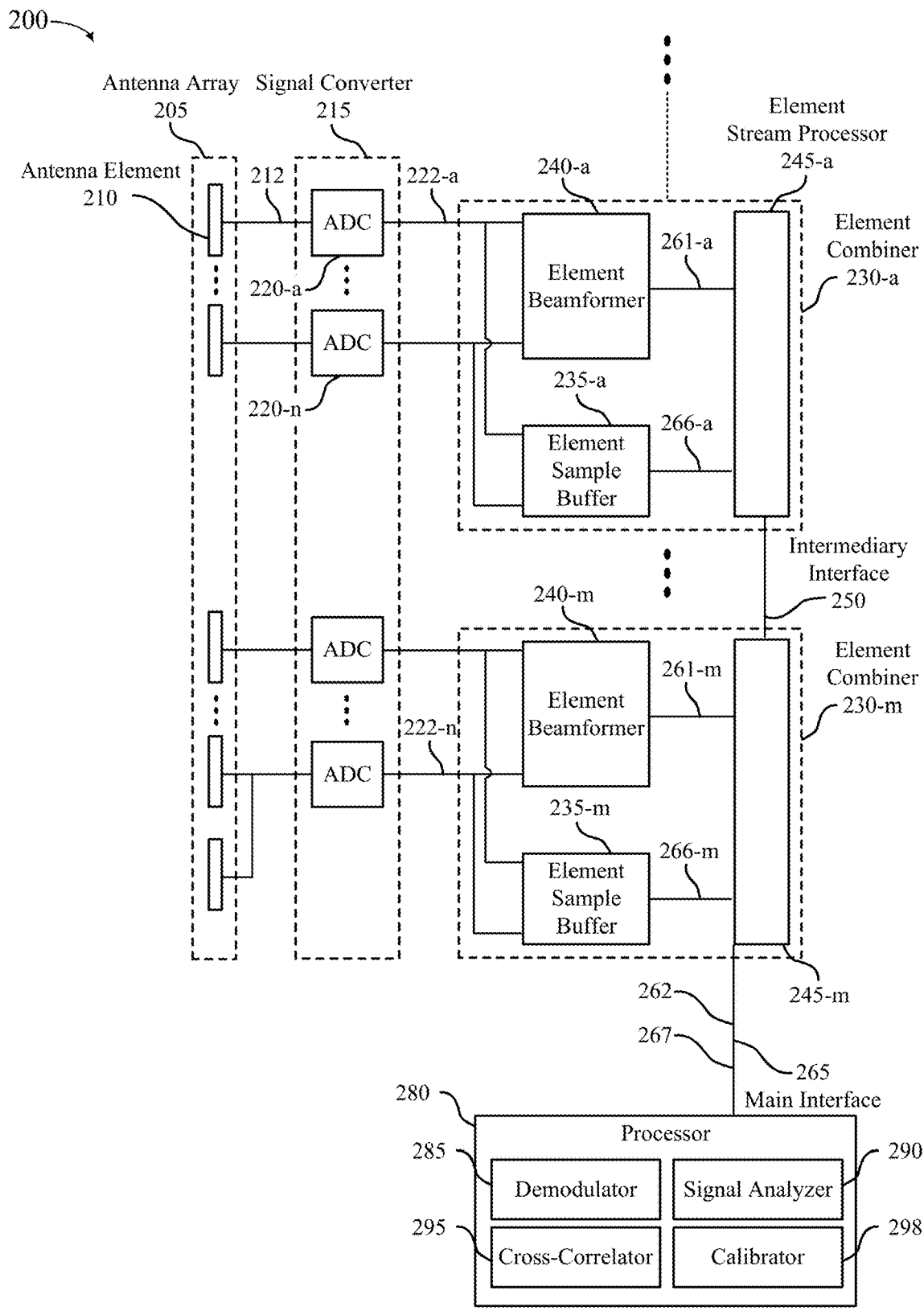

FIG. 2 shows a receiving device that supports simultaneous beamforming and surveying mode in accordance with examples as disclosed herein. Receiving device 200 may be configured to receive one or more signals from one or more transmitting devices (e.g., simultaneously). Receiving device 200 may be a wireless receiver such as an access node terminal, a satellite, or a user terminal as described herein and with reference to FIG. 1.

Receiving device 200 may depict an exemplary daisy-chain architecture for processing digital sample streams output by a large quantity of antenna elements. Receiving device 200 may include antenna array 205, signal converter 215, element combiners 230, intermediary interface 250, main interface 265, and processor 280. Antenna array 205 may be an example of antenna array 105 of FIG. 1A and may include antenna elements 210, which may be examples of antenna element 110 of FIG. 1A. Signal converter 215 may be an example of signal converter 115 of FIG. 1A. In some examples, element beamformers 240 may be a part of a beamformer (e.g., beamformer 160 of FIG. 1A) and element sample buffers 235 may be a part of a sample buffer (e.g., sample buffer 165 of FIG. 1A).

In some examples, an ADC 220 may be configured to convert an analog signal 212 received from an antenna element 210 to a digital sample stream 222. In some examples, an ADC 220 may be configured to convert an analog signal 212 received from multiple antenna elements 210 (e.g., a combined analog signal) to a digital sample stream 222—e.g., as depicted by the last ADC in signal converter 215 (that is, the bottommost ADC depicted in FIG. 2). Each ADC may be configured to output a digital sample stream 222 to a corresponding element combiner 230. For example, first ADC 220-$a$ through Nth ADC 220-$n$ may be configured to output N digital sample streams 222 to first element combiner 230-$a$ and the bottom set of ADCs may be configured to output L digital sample streams 222 to Mth element combiner 230-$m$, where the values of L and N may be the same or different.

First element combiner 230-$a$ may include first element sample buffer 235-$a$, first element beamformer 240-$a$, and first element stream processor 245-$a$. First element combiner 230-$a$ may receive a continuous stream of digital samples in the digital sample streams 222. First element combiner 230-$a$ may be configured to convert a set of digital sample streams 222 received from a corresponding set of ADCs (e.g., first ADC 220-$a$ through Nth ADC 220-$n$) to one or more first subarray signals 261-$a$ (e.g., using first element beamformer 240-$a$). To convert the set of digital sample streams 222 to the one or more first subarray signals 261-$a$, first element combiner 230-$a$ may apply one or more sets of beam weights to the set of digital sample streams 222. In some examples, the digital sample streams 222 may be referred to using the symbol $\bar{x}_i$ and the beam weights may be referred to using the symbol $\bar{w}_j$. For example, first element combiner 230-$a$ may apply a first set of beam weights $\bar{w}_A$ and a second set of beam weights $\bar{w}_B$ to a set of digital sample streams 222 ($\bar{x}_0, \bar{x}_1, \ldots, \bar{x}_n$) to obtain two sets of weighted digital sample streams ($\tilde{x}_{A0}, \tilde{x}_{A1}, \ldots, \tilde{x}_{An}$) and ($\tilde{x}_{B0}, \tilde{x}_{B1}, \ldots, \tilde{x}_{Bn}$). First element combiner 230-$a$ may also add the respective weighted digital sample streams together to obtain two first subarray signals 261-$a$ (which may be represented as $y_A$ and $y_B$).

First element combiner 230-$a$ may also be configured to buffer (e.g., using first element sample buffer 235-$a$) subsets of the digital sample streams 222—e.g., time-synchronized subsets of the digital sample streams 222. In some examples, the subsets of the digital sample streams 222 may be referred to as "snapshots." Looking at a portion of the digital sample streams 222 received during a duration (e.g., 10 ms duration), first element combiner 230-$a$ may buffer time-synchronized subsets of the digital samples received in the digital sample streams 222 over a portion of the duration (e.g., during a 10 μs, 100 μs, or 1 ms window of the duration). First element combiner 230-$a$ may also be configured to communicate the one or more first subarray signals 261-$a$ and the first buffered subsets 266-$a$ of the digital sample streams 222 to another component (e.g., Mth element combiner 230-$m$) in receiving device 200—e.g., to Mth element combiner 230-$m$ via intermediary interface 250. In some examples, first element combiner 230-*a* is a leading (or initial) element combiner 230 in a daisy-chain architecture. In other examples, first element combiner 230-*a* is an intermediary element combiner 230 in a daisy-chain architecture.

First element sample buffer 235-*a* may be configured to buffer subsets of the digital sample streams 222 received by first element combiner 230-*a*. First element beamformer 240-*a* may be configured to apply beam weights to digital sample streams 222 and combine resulting weighted signals to obtain one or more first subarray signals 261-*a*. First element stream processor 245-*a* may be configured to manage communication of the subsets of the digital sample streams 222 and one or more first subarray signals 261-*a* to other components in receiving device 200. In some examples, first element stream processor 245-*a* may be configured to periodically or aperiodically (e.g., in response to a triggering signal or event) store (e.g., temporarily) subsets of the digital sample streams 222 in first element sample buffer 235-*a*. First element stream processor 245-*a* may also be configured to periodically or aperiodically (e.g., in response to a triggering signal or event) transmit the subsets of the digital sample streams 222 to another component in receiving device 200. In some examples, first element stream processor 245-*a* temporarily stores a set of time-synchronized samples that correspond to a single sampling event in first element sample buffer 235-*a*. Additionally, or alternatively, first element stream processor 245-*a* may temporarily store a set of time-synchronized samples that correspond to multiple sampling events in first element sample buffer 235-*a*. In some examples, the element sample buffer 235-*a* may perform operations to extract spectral and/or spatial information from the samples.

In some examples, first element stream processor 245-*a* transmits the first buffered subsets 266-*a* of the digital sample streams over a different communication interface than the one or more first subarray signals 261-*a*—in some examples, the communication interface used for the first buffered subsets 266-*a* of the digital sample streams 222 may have less bandwidth than the communication interface used for the one or more first subarray signals 261-*a*. In other examples, first element stream processor 245-*a* may transmit the subsets of the digital sample streams 222 over a same communication interface as the one or more first subarray signals 261-*a*. First element stream processor 245-*a* may interleave the first buffered subsets 266-*a* of the digital sample streams 222 and one or more first subarray signals 261-*a* to transmit the first buffered subsets 266-*a* of the digital sample streams 222 and one or more first subarray signals 261-*a* over a same communication interface. In some examples, first element stream processor 245-*a* may packetize (e.g., generate packets that include) the first buffered subsets 266-*a* of the digital sample streams 222 and the one or more first subarray signals 261-*a* to obtain packets. For example, the first buffered subsets 266-*a* of the digital sample streams 222 may be included in first packets and the one or more first subarray signals 261-*a* may be included in second packets, and first element stream processor 245-*a* may transmit the first packets and the second packets over a communication interface in an interleaved fashion (e.g., one or more first packets may be included periodically in a stream of second packets to obtain a combined packet stream). The packets may include headers that provide information about the data included in the packets—e.g., the headers may indicate which element combiner generated the packets, a sampling index for the first buffered subsets 266-*a* of the digital sample streams 222 (that indicates when the first buffered subsets 266-*a* of the digital sample streams 222 were obtained relative to other subsets of the digital sample streams, the antenna elements associated with the packets, and the like).

Mth element combiner 230-*m* may include Mth element sample buffer 235-*m*, Mth element beamformer 240-*m*, and Mth element stream processor 245-*m*, which may perform similar functions as first element sample buffer 235-*a*, first element beamformer 240-*a* and first element stream processor 245-*a*. Mth element combiner 230-*m* may be similarly configured as first element combiner 230-*a*. That is, Mth element combiner 230-*m* may be configured to generate one or more beam signals and buffer subsets of digital sample streams based on digital sample streams obtained from a set of ADCs (e.g., the three bottom ADCs depicted in FIG. 2) that are coupled with a set of antenna element (e.g., the four bottom antenna elements depicted in FIG. 2). Mth element combiner 230-*m* may be the last element combiner in a daisy-chain architecture.

Mth element combiner 230-*m* may also be configured to receive subsets of digital sample streams 222 and one or more subarray signals 261 from another element combiner. Mth element combiner 230-*m* may be configured to combine the one or more Mth subarray signals 261-*m* generated at Mth element combiner 230-*m* with the one or more first subarray signals 261-*a* obtained from first element combiner 230-*a* to obtain one or more beam signals 262. Also, Mth element combiner 230-*m* may be configured to collate Mth buffered subsets 266-*m* of digital sample streams 222 buffered at Mth element combiner 230-*m* with first buffered subsets 266-*a* of digital sample streams 222 obtained from first element combiner 230-*a* to obtain collated subsets 267 of buffered subsets 266 of digital sample streams 222. When first element combiner 230-*a* is an intermediary element combiner, first element combiner 230-*a* may similarly be configured to combine one or more first subarray signals 261-*a* and collate buffered subsets 266 of digital sample streams 222 with one or more subarray signals 261 and subsets of digital sample streams 222 received from an adjacent element combiner 230. Additionally, Mth element combiner 230-*m* may be configured to communicate the one or more beam signals 262 and collated subsets 267 of the digital sample streams 222 to another component within receiving device 200—e.g., to processor 280 via main interface 265.

In some examples, Mth element beamformer 240-*m* may additionally be configured to combine one or more subarray signals 261 received from another element stream processor 245 with one or more Mth subarray signals 261-*m* generated by Mth element combiner 230-*m*. In such cases, Mth element beamformer 240-*m* may be referred to as an element/subarray beamformer. Mth element stream processor 245-*m* may additionally be configured to manage communication of collated subsets 267 of the digital sample streams 222 and the one or more beam signals 262 generated by Mth element beamformer 240-*m* after a combining operation.

Intermediary interface 250 may be configured to communicatively couple first element combiner 230-*a* with Mth element combiner 230-*m*. Intermediary interface 250 may be capable of communicating an amount of information from first element combiner 230-*a* such that the one or more subarray signals 261 and subsets of digital sample streams 222 may be communicated while supporting real-time communication of the one or more subarray signals 261. Intermediary interface 250 may be a bus that includes multiple parallel signal paths for parallel communications or a bus that includes a single signal path for serial communications.

Intermediary interface 250 may be a network interface such as an Ethernet, Fibre Channel, or asynchronous transfer mode (ATM) bus, a peripheral interface such as a peripheral component interconnect (PCI) bus, a serializer-deserializer (SERDES) bus, a Fast Passive Parallel (FPP) bus, or optical interconnect.

Main interface 265 may be configured to communicatively couple Mth element combiner 230-m with processor 280. Main interface 265 may be similarly configured as intermediary interface 250. Main interface 265 may be capable of communicating an amount of information from Mth element combiner 230-m such that the one or more beam signals 262 and collated subsets 267 of digital sample streams 222 may be communicated while supporting real-time communication of the one or more beam signals 262. In some examples, a bandwidth of main interface 265 is greater than a bandwidth of intermediary interface 250— e.g., to support the communication of additional subsets of digital sample streams. Main interface 265 may be a network interface such as an Ethernet, Fibre Channel, or ATM bus, a peripheral interface such as a PCI bus, a SERDES bus, an FPP bus, or optical interconnect.

Processor 280 may include demodulator 285, signal analyzer 290, cross-correlator 295, and calibrator 298. In some examples, one or more of demodulator 285, signal analyzer 290, cross-correlator 295, and/or calibrator 298 may be positioned external to processor 280, and main interface 265 may be coupled with processor 280 and the external component(s). Processor 280 may be configured to process one or more beam signals and subsets of digital sample streams received from Mth element combiner 230-m. Processor 280 may be configured to extract data from the one or more beam signals 262 and to use the collated subsets 267 of the digital sample streams 222 to determine spatial and/or spectral characteristics for RF signals detected in the vicinity (e.g., within a field of view) of receiving device 200.

Demodulator 285 may be configured to demodulate the one or more beam signals 262 received from Mth element combiner 230-m before decoding the demodulated beam signals. Signal analyzer 290 may be configured to analyze the collated subsets 267 of digital sample streams 222 received from Mth element combiner 230-m. In some examples, signal analyzer 290 performs signal processing (e.g., convolution, eigenvector analysis, and/or an FFT analysis) of the collated subsets 267 of digital sample streams 222. In some examples, the analysis may be used by processor 280 to generate a spatial/spectrum map that indicates a direction from which different RF signals detected at antenna array 205 are received and a frequency range in which the different signals are received. In some examples, the spatial/spectrum map may be used to adapt signal filters used to process received RF signals, where the signal filters may be coupled with the antenna elements or the beamformers. For example, the spatial/spectrum map may be used to refine a bandpass filter to filter out frequencies associated with an interfering RF signal identified by signal analyzer 290. Signal analyzer 290 may be used to identify targets of interest and to buffer beam signals to support operations such as identification, communication, or surveillance.

Cross-correlator 295 may use the subsets of digital sample streams to identify the spatial and/or spectral characteristics for the detected RF signals. For example, cross-correlator 295 may identify similarities and/or differences between (or cross-correlate) signals obtained at the antenna elements of antenna array 205. Cross-correlator 295 may be further configured to adjust beam weights applied to digital sample streams 222 by the beamformers based on the identified similarities and/or differences. For example, cross-correlator 295 may be configured to adjust the beam weights based on the identified differences to increase a signal-to-noise ratio of the different signals. In some examples, cross-correlator 295 may be configured to process the collated subsets 267 of digital sample streams 222 according to multiple beam weight sets (e.g., calculated according to an estimated direction of incidence of the desired beam signal) to determine a beam weight set with the highest signal strength or signal-to-noise ratio. In some examples, cross-correlator 295 may implement dithering of a receive beam for receiving device 200. In some examples, calibrator 298 may use the collated subsets 267 of digital sample streams 222 to identify offsets between antenna elements of antenna array 205, where the identified offsets for a set of antenna elements may be different than an offset determined for the set of antenna elements at an initial calibration stage. Calibrator 298 may be further configured to adjust the beam weights applied to RF signals received from the set of antenna elements to compensate for the change in the offset. Additionally, or alternatively, calibrator 298 may measure an SNR for an RF signal while adjusting the beam weights and identify one or more beam weights (e.g., corresponding to one or more antenna elements 210) that increases (e.g., maximizes) the SNR for the signal. Calibrator 298 may be further configured to determine other offsets (e.g., frequency offsets) for each antenna element to compensate for the offsets by adjusting components of the signal converter 215 (e.g., local oscillators, mixers).

Figure 3:
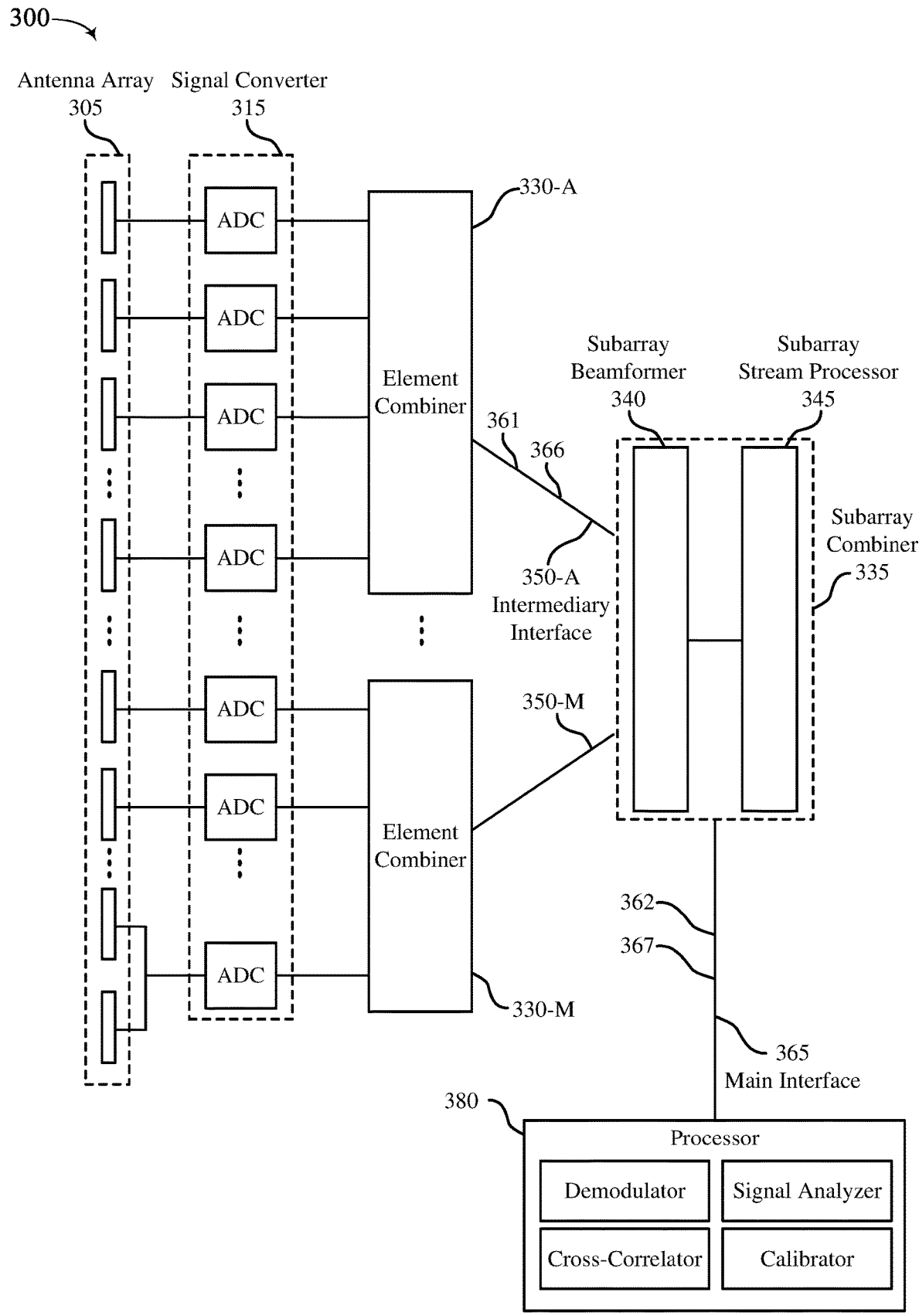

FIG. 3 shows a receiving device that supports simultaneous beamforming and survey modes in accordance with examples as disclosed herein. Receiving device 300 may be configured to receive one or more signals from one or more transmitting devices (e.g., simultaneously). Receiving device 300 may be an access node terminal, a satellite, or a user terminal as described herein and with reference to FIG. 1. Receiving device 300 may be an example of a receiving device 200 as described with reference to FIG. 2.

Receiving device 200 may depict an exemplary corporate-feed architecture for processing digital sample streams output by a large quantity of antenna elements. In some examples, a corporate-feed architecture may have lower latency and use less memory for coherent summing, while a daisy-chain architecture may simplify the layout and connectivity for the backplane and subarrays. Receiving device 300 may include antenna array 305, signal converter 315, element combiners 330, intermediary interfaces 350, main interface 365, and processor 380, which may be examples of an antenna array 205, signal converter 215, element combiners 230, intermediary interface 250, main interface 265, and processor 280 as described with reference to FIG. 2.

First element combiner 330-a and Mth element combiner 330-m may receive and process digital sample streams received from groups of ADCs as described with reference to FIG. 2. However, unlike in FIG. 2, first element combiner 330-a and Mth element combiner 330-m may not be configured with a capability to combine one or more subarray signals generated at an element combiner with one or more subarray signals received from another element combiner and collate subsets of digital sample streams buffered at an element combiner with subsets of digital sample streams received from another element combiner (or the capability may be disabled). Instead first element combiner 330-a and Mth element combiner 330-m (and any element combiners in between) may transmit one or more subarray signals generated a respective element combiner and buffered subsets of digital sample streams buffered at a respective element combiner to subarray combiner 335 via first intermediary interface 350-a and Mth intermediary interface 350-m.

First intermediary interface 350-a may be configured to communicatively couple first element combiner 330-a with subarray combiner 335. First intermediary interface 350-a may be capable of communicating an amount of information from first element combiner 330-a such that the one or more subarray signals and buffered subsets of digital sample streams may be communicated while supporting real-time communication of the one or more subarray signals. First intermediary interface 350-a may be a bus that includes multiple parallel signal path for parallel communications or a bus that includes a single signal path for serial communications. Mth intermediary interface 350-m may be similarly configured as first intermediary interface 350-a and configured to communicatively couple Mth element combiner 330-m with subarray combiner 335. First intermediary interface 350-a may be a network interface such as an Ethernet, Fiber Channel, or ATM bus, a peripheral interface such as a PCI bus, a SERDES bus, an FPP bus, or optical interconnect.

Subarray combiner 335 may include subarray beamformer 340 and subarray stream processor 345. Subarray combiner 335 may be configured to combine multiple sets of one or more subarray signals received from multiple element combiners to obtain one or more beam signals 362. Subarray combiner 335 may also be configured to collate multiple buffered subsets of digital sample streams receive from the multiple element combiners to obtain collated subsets 367 of the digital sample streams. In some examples, subarray combiner 335 may perform all or some of the functionality for combining and collating subarray signals and buffered subsets of digital sample streams described with reference to Mth element combiner 230-m of FIG. 2.

Subarray beamformer 340 may be configured to combine sets of one or more subarray signals received from multiple element combiners to obtain one or more beam signals 362—e.g., subarray beamformer 340 may be configured to combine a first set of one or more subarray signals 361 received from first element combiner 330-a and a second set of one or more subarray signals received from Mth element combiner 330-m.

Subarray stream processor 345 may be configured to collate buffered subsets of digital sample streams received from multiple element combiners to obtain collated subsets 367 of digital sample streams—e.g., subarray stream processor 345 may be configured to combine a first buffered subset 366 of digital sample streams received from first element combiner 330-a and a second buffered subset of digital sample streams received from Mth element combiner 330-m. In some examples, subarray stream processor 345 may include a buffer used to buffer the collated subsets 367 of digital sample streams. Subarray stream processor 345 may also be configured to interleave transmissions of the one or more beam signals 362 and the collated subsets 367 of digital sample streams to processor 380 via main interface 365. In some examples, subarray stream processor 345 packetizes the one or more beam signals 362 and the collated subsets 367 of the digital sample streams to obtain packets for transmission via main interface 365. For example, subarray stream processor 345 may generate first packets containing the one or more beam signals 362 and second packets containing the collated subsets 367 of digital samples streams, and subarray stream processor 345 may transmit the first packets and second packets to processor 380 in an interleaved manner in a combined packet stream.

Main interface 365 may be configured to communicatively couple subarray combiner 335 with processor 380. Main interface 365 may be capable of communicating an amount of information from first element combiner 330-a such that the one or more beam signals 362 and collated subsets 367 of digital sample streams may be communicated while supporting real-time communication of the one or more beam signals 362. Main interface 365 may be a bus that includes multiple parallel signal path for parallel communications or a bus that includes a single signal path for serial communications. In some examples, a bandwidth of main interface 365 may be greater than a bandwidth of the individual interfaces between the element combiners and the subarray combiner(s) but less than a combined bandwidth of the individual interfaces between the element combiners and the subarray combiner(s) Main interface 365 may be a network interface such as an Ethernet, Fibre Channel, or ATM bus, a peripheral interface such as a PCI bus, a SERDES bus, an FPP bus, or optical interconnect.

Processor 380 may include a demodulator, signal analyzer, cross-correlator, calibrator, or any combination thereof. Processor 380 may be similarly configured to extract data, analyze signals, adjust beam weights, or any combination thereof as described with reference to processor 280 of FIG. 2.

Figure 4:
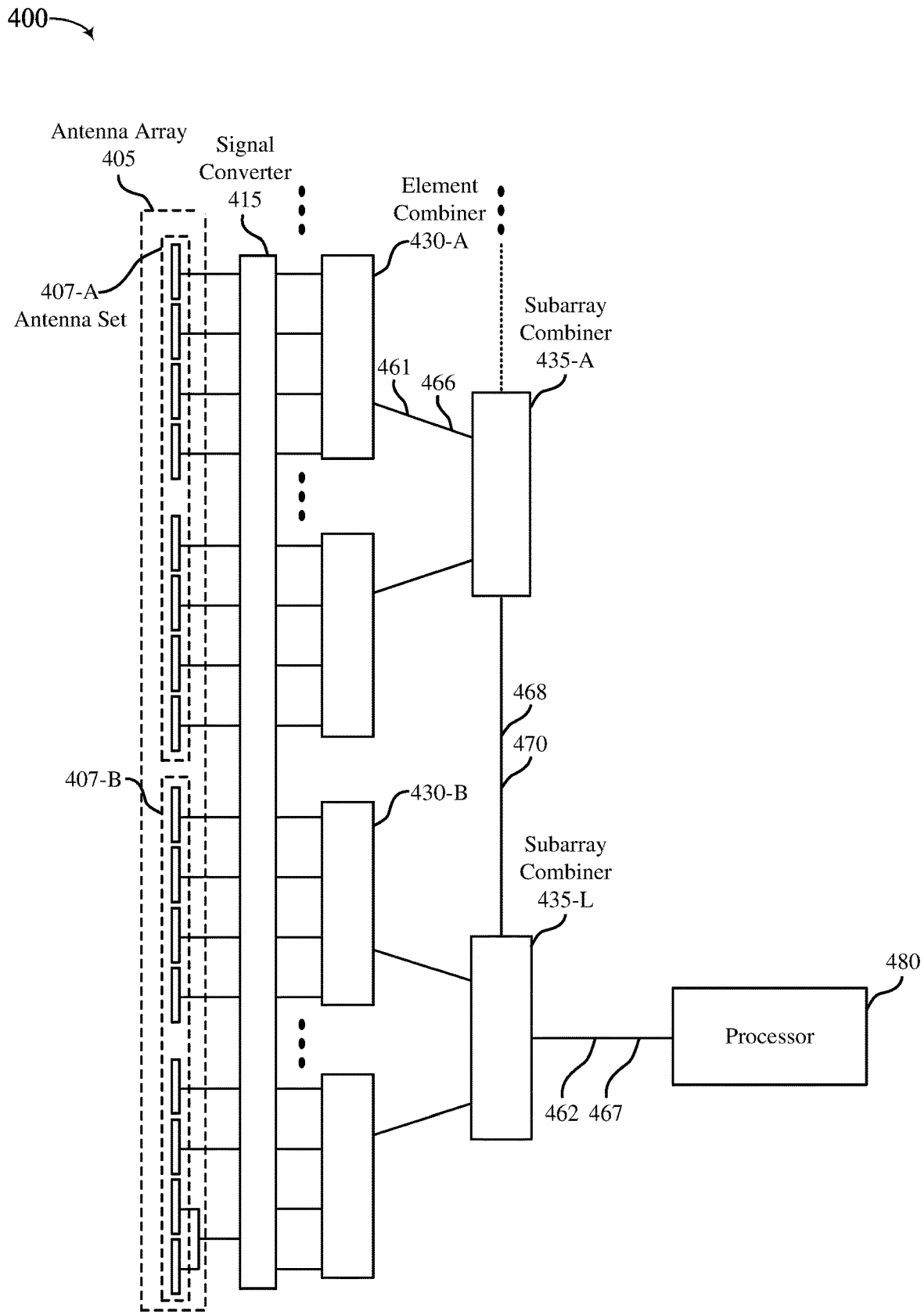

FIG. 4 shows a receiving device that supports simultaneous beamforming and survey modes in accordance with examples as disclosed herein. Receiving device 400 may be configured to receive one or more signals from one or more transmitting devices (e.g., simultaneously). Receiving device 400 may be an access node terminal, a satellite, or a user terminal as described herein and with reference to FIG. 1. Receiving device 400 may be an example of a receiving device described herein and with reference to FIGS. 2 and 3.

Receiving device 400 may depict an exemplary combined daisy-chain/corporate-feed architecture for processing digital sample streams output by a large quantity of antenna elements. Receiving device 400 may include antenna array 405, signal converter 415, and processor 480, which may be examples of antenna arrays, signal converters, and processors described in FIGS. 2 and 3. Receiving device 400 may also include element combiners 430 and subarray combiners 435.

Antenna array 405 may include first antenna set 407-a and second antenna set 407-b. First antenna set 407-a may include a first set of antenna elements that are coupled with a first set of ADCs in signal converter 415, a first set of element combiners (e.g., including first element combiner 430-a), and one or more subarray combiners (e.g., subarray combiner 435-a). The ADCs, element combiners, and subarray combiner 435-a coupled with first antenna set 407-a may be configured in accordance with a corporate-feed architecture, as similarly described with reference to FIG. 3. In some examples, subarray combiner 435-a may also be arranged in a daisy-chain architecture with other subarray combiners, such as Lth subarray combiner 435-1, as similarly described with reference to FIG. 2. Subarray combiner 435-a may be positioned in a leading position of the daisy-chain or an intermediary position of the daisy-chain.

Second antenna set 407-b may include a second set of antenna elements that are coupled with a second set of ADCs in signal converter 415, a second set of element combiners (e.g., including second element combiner 430-b), and one or more subarray combiners (e.g., Lth subarray combiner 435-1), which may also be configured in accordance with a corporate-feed architecture, as similarly described with reference to FIG. 3. Lth subarray combiner 435-1 may also be arranged in the daisy-chain architecture with other subarray combiners, such as subarray combiner 435-a. Lth subarray combiner 435-1 may be positioned in a trailing position of the daisy-chain configuration. In some examples, a subarray combiner 435 may be configured to combine subarray signals 461 received from respective element combiners 430 to obtain one or more array signals 468. A subarray combiner 435 may also be configured to combine buffered subsets 466 of digital sample streams from respective element combiners 430 to obtain one or more array buffered subsets 470.

Lth subarray combiner 435-1 (and similarly subarray combiner 435-a when in an intermediary position) may combine one or more array signals generated at Lth subarray combiner 435-1 with one or more array signals 468 received from an adjacent subarray combiner (e.g., subarray combiner 435-a), as similarly described with reference to FIG. 2 for combining subarray signals. Lth subarray combiner 435-1 (and similarly subarray combiner 435-a when in an intermediary position) may also collate array buffered subsets of digital sample streams obtained at Lth subarray combiner 435-1 with array buffered subsets 470 of digital sample streams received from an adjacent subarray combiner (e.g., subarray combiner 435-a), as similarly described with reference to FIG. 2. Lth subarray combiner 435-1 may communicate one or more resulting beam signals 462 and collated subsets 467 of digital sample streams to processor 480. Processor 480 may process the received beam signals 462 and collated subsets 467 of digital sample streams to obtain communicated data and to determine spectral and/or spatial characteristics of RF signals transmitted in a vicinity of receiving device 400.

Figure 5:
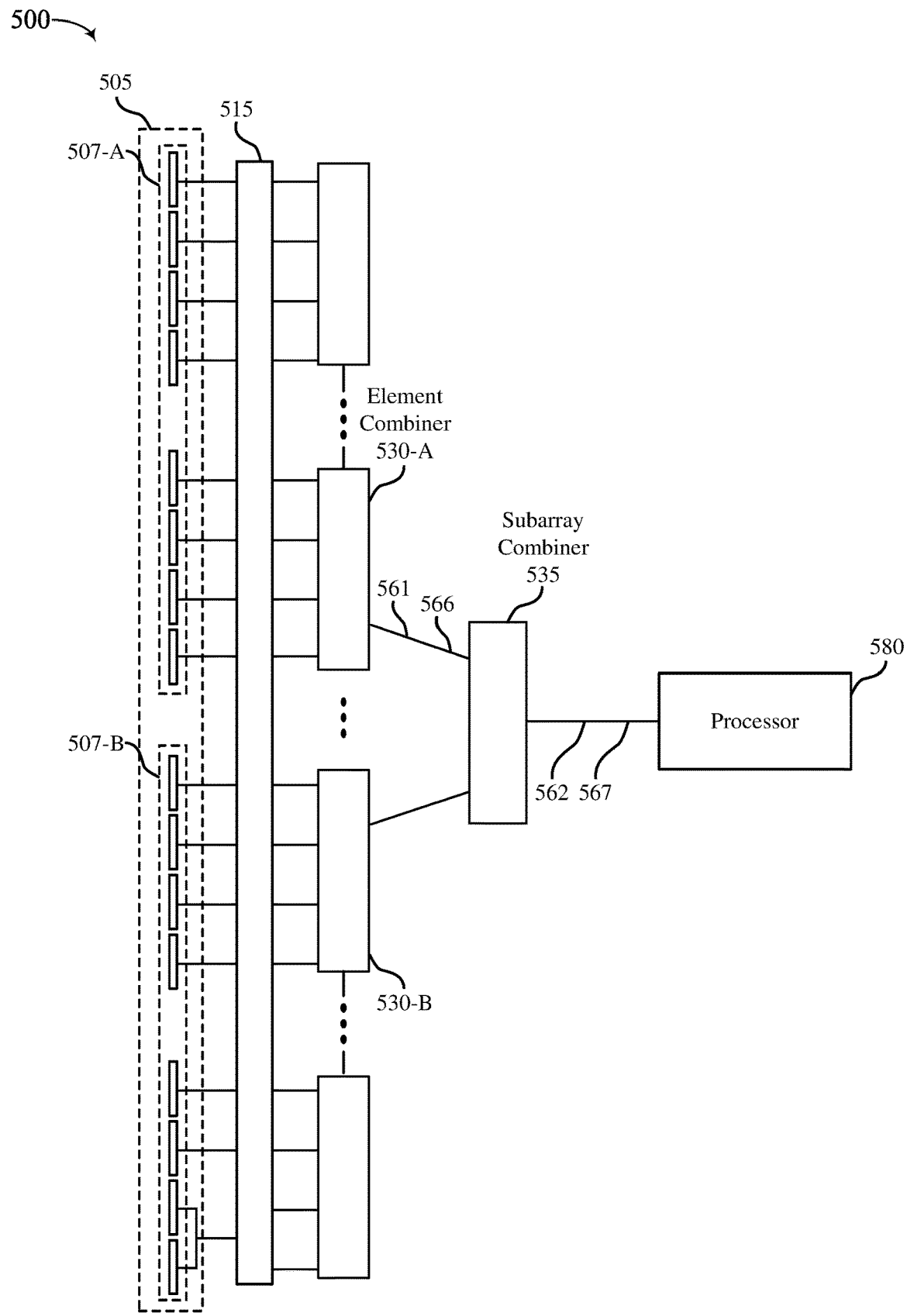

FIG. 5 shows a receiving device that supports simultaneous beamforming and survey modes in accordance with examples as disclosed herein. Receiving device 500 may be configured to receive one or more signals from one or more transmitting devices (e.g., simultaneously). Receiving device 500 may be an access node terminal, a satellite, or a user terminal as described herein and with reference to FIG. 1. Receiving device 500 may be an example of a receiving device described herein and with reference to FIGS. 2 and 3.

Receiving device 500 may depict an exemplary combined corporate-feed/daisy-chain architecture for processing digital sample streams output by a large quantity of antenna elements. Receiving device 500 may include antenna array 505, signal converter 515, and processor 580, which may be examples of antenna arrays, signal converters, and processors described in FIGS. 2 and 3. Receiving device 500 may also include element combiners 530 and subarray combiner 535.

Antenna array 505 may include first antenna set 507-a and second antenna set 507-b. First antenna set 507-a may include a first set of antenna elements that are coupled with a first set of ADCs in signal converter 515 and a first set of element combiners (e.g., including first element combiner 530-a). The ADCs and element combiners coupled with first antenna set 507-a may be configured in accordance with a daisy-chain architecture, as similarly described with reference to FIG. 2. In some examples, the element combiners coupled with first antenna set 507-a may also be coupled with subarray combiner 535.

Second antenna set 507-b may include a second set of antenna elements that are coupled with a second set of ADCs in signal converter 515 and a second set of element combiners (e.g., including second element combiner 530-b). The ADCs and element combiners coupled with second antenna set 507-b may be configured in accordance with a daisy-chain architecture, as similarly described with reference to FIG. 2. In some examples, the element combiners coupled with second antenna set 507-b may also be coupled with subarray combiner 535. Thus, the element combiners coupled with first antenna set 507-a, the element combiners coupled with second antenna set 507-b, and subarray combiner 535 may be configured in accordance with a corporate-feed architecture as similarly described with reference to FIG. 3.

Subarray combiner 535 may combine one or more subarray signals 561 generated at first element combiner 530-a with one or more subarray signals 561 received from additional element combiners, such as second element combiner 530-b, as similarly described with reference to FIG. 3. Subarray combiner 535 may also collate buffered subsets 566 of digital sample streams received from first element combiner 530-a with buffered subsets 566 of digital sample streams received from additional element combiners, such as second element combiner 530-b, as similarly described with reference to FIG. 3. Subarray combiner 535 may communicate the one or more resulting beam signals 562 and collated subsets 567 of digital sample streams to processor 580. Processor 580 may process the received beam signals 532 and collated subsets 567 of digital sample streams to obtain communicated data and to determine spectral and/or spatial characteristics of RF signals transmitted in a vicinity of receiving device 500.

Figure 6A:
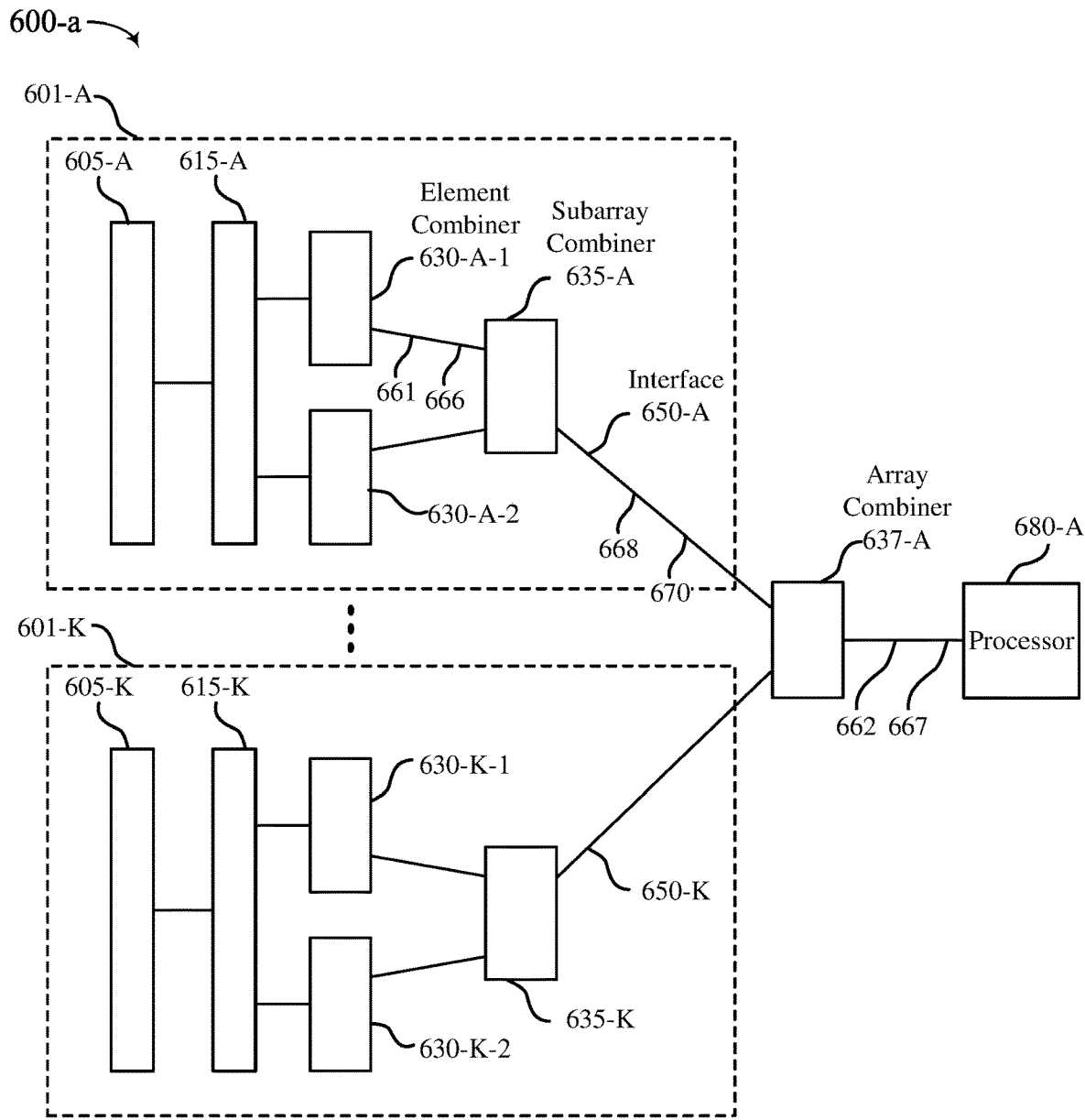

FIG. 6A shows a receiving device that supports simultaneous beamforming and survey modes in accordance with examples as disclosed herein. Receiving device 600-a may be configured to receive one or more signals from one or more transmitting devices (e.g., simultaneously). Receiving device 600-a may be an access node terminal, a satellite, or a user terminal as described herein and with reference to FIG. 1. Receiving device 600-a may be an example of a receiving device described herein and with reference to FIGS. 2-3.

Receiving device 600-a may depict an exemplary expanded corporate-feed architecture for processing digital sample streams output by a large quantity of antenna elements. Receiving device 600-a may include processor 680-a, which may be an example of a processor as described with reference to FIGS. 2 through 5. Receiving device 600-a may also include antenna panels 601 and array combiner 637-a.

First antenna panel 601-a may include first antenna array 605-a and Kth antenna panel 601-k may include Kth antenna array 605-k. First antenna array 605-a may include a first set of antenna elements and Kth antenna array 605-k may include a second set of antenna elements. In some examples, first antenna array 605-a and Kth antenna array 605-k are included in a same antenna array but are physically separated from one another by a significant distance (e.g., >1 meter). First antenna panel 601-a may also include first signal converter 615-a, first element combiner 630-a-1, second element combiner 630-a-2 (and possibly additional element combiners 630-a), and first subarray combiner 635-a, which may be examples of signal converters, element combiners, and subarray combiners described herein and with reference to FIG. 3. Element combiners 630 may communicate subarray signals 661 and buffered subsets 666 of digital sample streams to subarray combiners 635.

Similarly, Kth antenna panel 601-k may also include Kth signal converter 615-k, element combiners 630-k-1 and 630-k-2 (and possibly additional element combiners 630-k), and Kth subarray combiner 635-k. First antenna panel 601-a may also include first interface 650-*a* and Kth antenna panel 601-*k* may include Kth interface 650-*k*. First interface 650-*a* may be configured to communicate information (e.g., array signals 668 and array buffered subsets 670 of digital sample streams) from first antenna panel 601-*a* to array combiner 637-*a*. Kth interface 650-*k* may be configured to communicate information (e.g., array signals 668 and array buffered subsets 670 of digital sample streams) from Kth antenna panel 601-*k* to array combiner 637-*a*.

Array combiner 637-*a* may be configured to combine one or more array signals 668 received from first antenna panel 601-*a* (via first subarray combiner 635-*a*) and one or more array signals 668 received from additional antenna panels (e.g., Kth antenna panel 601-*k* via Kth subarray combiner 635-*k*). Array combiner 637-*a* may also be configured to collate array buffered subsets 670 of digital sample streams received from first antenna panel 601-*a* (via first subarray combiner 635-*a*) and array buffered subsets 670 of digital sample streams received from received from additional antenna panels (e.g., Kth antenna panel 601-*k* via Kth subarray combiner 635-*k*). Array combiner 637-*a* may be configured to transmit the resulting one or more beam signals 662 and collated subsets 667 of the digital sample streams to processor 680-*a*. To synchronize the communication of the data being communicated throughout receiving device 600-*a*, receiving device 600-*a* may package information in blocks (or "chunks") as described in more detail herein and with reference to FIG. 6B.

Figure 6B:
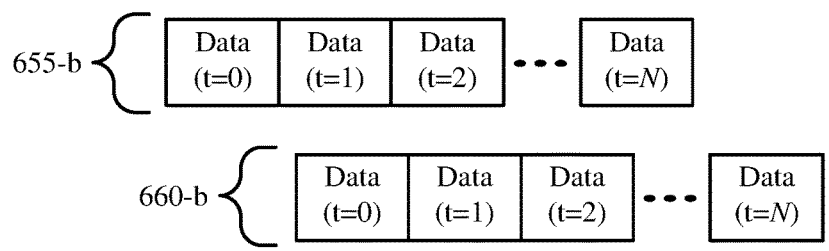
FIG. 6B shows a signal propagation diagram for simultaneous beamforming and surveying modes in accordance with examples as disclosed herein.

FIG. 6B shows a signal propagation diagram for simultaneous beamforming and surveying modes in accordance with examples as disclosed herein. Signal propagation diagram 651-*b* may depict the propagation of signals within receiving device 600-*a*. In some examples, signal propagation diagram 651-*b* depicts the propagation of data signals transmitted via first interface 650-*a* (e.g., a first data signal including first packet 655-*b*) and of data signals transmitted via Kth interface 650-*k* (e.g., a Kth data signal including Kth packet 660-*b*).

As described herein, information within receiving device 600-*a* may be communicated in packets or blocks to maintain synchronicity across receiving device 600-*a*. In some examples, first subarray combiner 635-*a* may transmit data (e.g., one or more array signals and array buffered subsets of digital sample streams) associated with a first set of digital samples (e.g., N digital samples) to array combiner 637-*a* via first interface 650-*a*. In some examples, the quantity of digital samples associated with the data transmission is based at least in part on a worst-case propagation delay for signal within receiving device 600-*a*, or a propagation error or difference for signals within receiving device 600-*a*. For example, if the worst-case propagation delay from a kth antenna panel is spans across ten digital samples, then N may be equal to nine or less than nine. Alternatively, the quantity of digital samples associated with the data transmission may be selected such that the block length of the digital samples is greater than a propagation error or difference between different element combiners 630 (e.g., a propagation difference between an element combiner 630 having the least propagation delay to an element combiner 630 having a highest propagation delay, accounting for differences in the interfaces including first interface 650-*a* and Kth interface 650-*k*). Similarly, Kth subarray combiner 635-*k* may transmit data associated with a second set of digital samples to array combiner 637-*a* via Kth interface 650-*k*.

In some examples, first subarray combiner 635-*a* transmits first packet 655-*b* to array combiner 637-*a* via first interface 650-*a*, and Kth subarray combiner 635-*k* transmits Kth packet 660-*b* to array combiner 637-*a* via Kth interface 650-*k*. Array combiner 637-*a* may align a beginning of first packet 655-*b* and Kth packet 660-*b* before processing the information received from first subarray combiner 635-*a* and Kth subarray combiner 635-*k*. In some examples, array combiner 637-*a* may keep track of a quantity of received data samples—so that array combiner 637-*a* may separate data packets or blocks from one another. After synchronizing (e.g., in time) the received information, array combiner 637-*a* may combine one or more received beam signals and collate subsets of digital sample streams included in the received information. Array combiner 637-*a* may then transmit the resulting one or more beam signals and collated subsets of digital sample streams to processor 680-*a*, which may process the information as similarly described with herein and with reference to FIGS. 2 through 5. By transmitting data in packets or blocks, signaling overhead for maintaining time synchronization between signals (e.g., beam signals and signals including subsets of digital sample streams) may be reduced.

Figure 7:
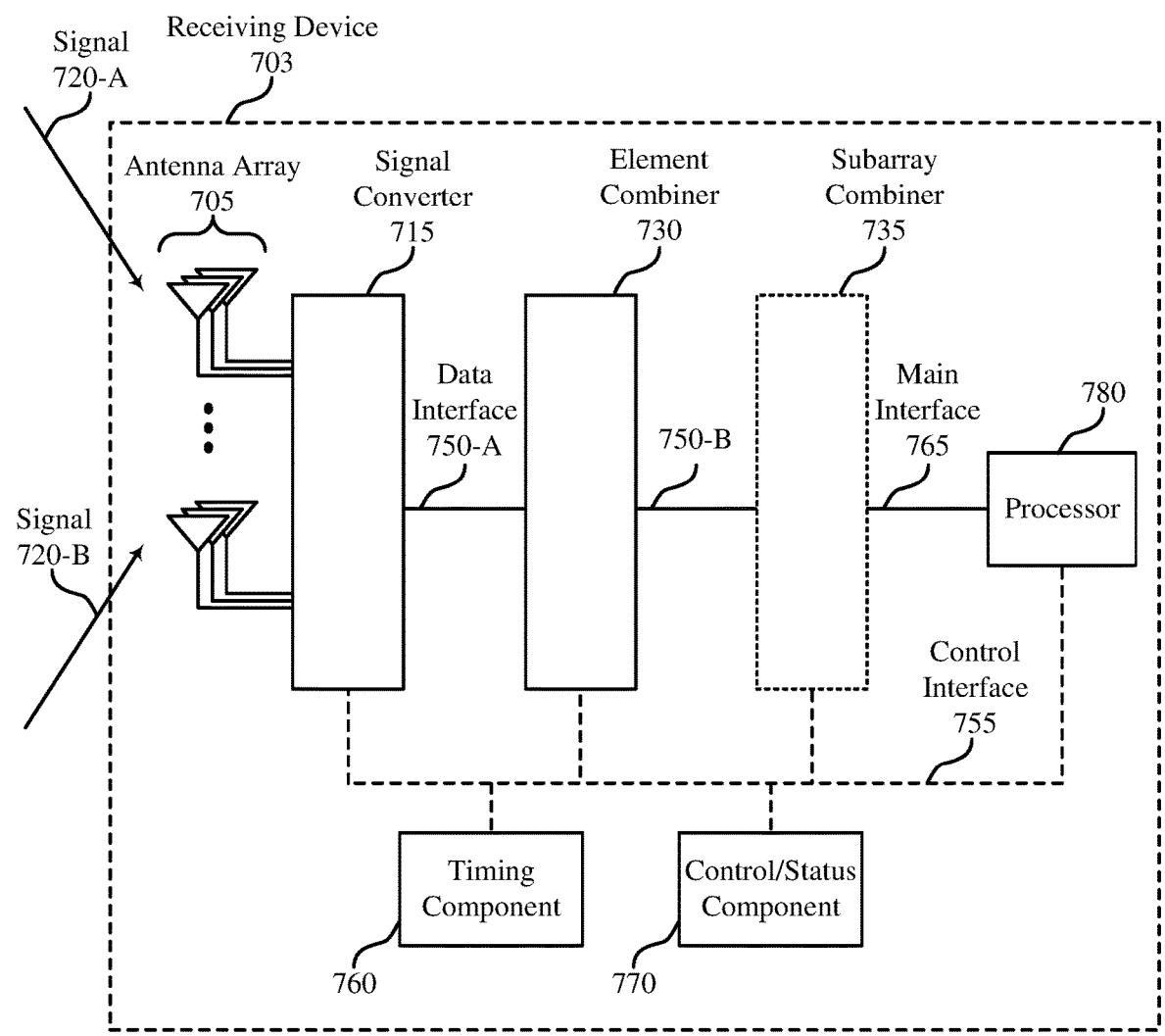
FIG. 7 shows a signal processing diagram for simultaneous beamforming and surveying modes in accordance with examples as disclosed herein.

FIG. 7 shows a signal processing diagram for simultaneous beamforming and surveying modes in accordance with examples as disclosed herein. Signal processing diagram 700 may depict the reception of signals within receiving device 703, which may be an example of a receiving device described with reference to FIGS. 2 through 6A.

Receiving device 703 may include one or more antenna arrays (such as antenna array 705), signal converter 715, element combiner 730, and processor 780. Antenna array 705 may include multiple antenna elements, where subsets of the antenna elements may be grouped together. Signal converter 715 may include multiple ADCs and may be an example of the signal converters described herein and with reference to FIGS. 2 through 6A. Element combiner 730 may include multiple element combiners as described herein and with reference to FIGS. 2 through 6A. Processor 780 may be an example of a processor described herein and with reference to FIGS. 2 through 6A. For example, processor 780 may include one or more of the components of processor 280, which may be co-located, or located in different locations or computing nodes, in some cases.

Receiving device 703 may also include subarray combiner 735 which may include one or more subarray combiners as described herein and with reference to FIGS. 2 through 6A. In some examples, receiving device 703 does not include subarray combiner 735—e.g., if element combiner 730 is configured in a daisy-chain architecture. Receiving device may also include timing component 760 and control/status component 770. Element sample buffers may be directly or indirectly polled by control/status component 770.

Receiving device may also include first data intermediary interface 750-*a*, second data intermediary interface 750-*b*, main data interface 765, and control interface 755. First data intermediary interface 750-*a* may couple signal converter 715 with element combiner 730 and be configured to convey digital sample streams to element combiner 730. Second data intermediary interface 750-*b* may be couple element combiner 730 with subarray combiner 735 and be configured to convey one or more beam signals and subsets of the digital sample streams to subarray combiner 735. Main data interface 765 may couple subarray combiner 735 with processor 780 and be configured to convey one or more beam signals and collated subsets of digital sample streams to subarray combiner 735. If receiving device 703 does not include subarray combiner 735, second data intermediary interface 750-b and main data interface 765 may be the same interface. Also, the functionality for combining subarray signals and collating buffered subsets of digital sample streams may be moved within element combiner 730. Control interface 755 may be coupled with signal converter 715, element combiner 730, subarray combiner 735, processor 780, timing component 760, control/status component 770, or any combination thereof. Control interface 755 may be configured to convey control information (e.g., clock signals, maintenance signals, etc.) within receiving device 703. In some examples, control interface 755 may be configured to convey buffered subsets of digital sample streams from signal converter 715 or element combiner 730 to processor 780.

As described herein, element combiner 730 and subarray combiner 735 may be configured with stream processors that are used to manage the communication of information across the different interfaces. In some examples, element combiner 730 is configured to transmit one or more beam signals and collated subsets of digital sample streams over second data intermediary interface 750-b in an interleaved fashion. In other examples, element combiner 730 is configured to transmit one or more beam signals over second data intermediary interface 750-b and collated subsets of digital sample streams over control interface 755. Similarly, subarray combiner 735 may be configured to transmit beam signals and collated subsets of digital sample streams via main data interface 765 in an interleaved fashion or separately over main data interface 765 and control interface 755. In some examples, signal converter 715 may be configured to continuously transmit digital sample streams over first data intermediary interface 750-a and periodically transmit subsets of digital sample streams over control interface 755 to processor 780—e.g., when a triggering signal is received.

Timing component 760 may be configured to send timing signals to components within receiving device 703. In some examples, timing component 760 may be configured to transmit (e.g., periodically or aperiodically) a timing signal that causes a component (e.g., signal converter 715 or element combiner 730) to capture a subset of samples from a digital sample stream. In some examples, the subsets of samples are synchronized in time based on each component that receives the signal capturing the subset of samples at a same time and for a same duration. The timing signal (or a second timing signal transmitted by timing component 760) may also cause the components to transmit the captured snapshots to processor 780.

Control/status component 770 may be configured to manage the operation of receiving device 703. In some examples, control/status component 770 may send signals configuring the component within receiving device 703 to operate in a particular mode and/or requesting operating information from components within receiving device 703. In some examples, control/status component 770 may be configured to transmit (e.g., periodically or aperiodically) a timing signal that causes a component (e.g., signal converter 715 or element combiner 730) to capture a predetermined quantity of samples from a digital sample stream. The timing signal (or a second timing signal transmitted by control/status component 770) may also cause the components to transmit the captured subset of the digital sample stream to processor 780.

In some examples, receiving device 703 may receive first signal 720-a and second signal 720-b, which may be RF signals. First signal 720-a may arrive from a first direction and be transmitted from a first device, and second signal 720-b may arrive from a second direction and be transmitted from a second device. One or both of first signal 720-a and second signal 720-b may be intended for receiving device 703. In some examples, receiving device 703 may receive additional signals from different directions. Each antenna element of antenna array 705 may receive both first signal 720-a and second signal 720-b and output an analog signal corresponding to first signal 720-a and second signal 720-b. The analog signals output by the different antenna elements may be different from one another—e.g., due to the position and/or orientation of the different antenna elements. These differences may be used to determine a spatial component (e.g., an angle of arrival) of the signals. The analog signals may be passed to signal converter 715. In some examples, the analog signals may be filtered (e.g., in frequency) before being passed to signal converter 715.

Signal converter 715 may include multiple ADCs that are used to convert the analog signals received from antenna array 705 into streams of digital samples. Signal converter 715 may transmit the digital sample streams over first data intermediary interface 750-a to element combiner 730. In some examples, signal converter 715 may also transmit subsets of each of the digital sample streams over control interface 755 e.g., after receiving a trigger signal. The digital sample streams output by the multiple ADCs may be represented as $\bar{x}=(\bar{x}_0, \bar{x}_1, \ldots, \bar{x}_N)$, where signal converter 715 may include (N+1) ADCs and each digital sample stream $\bar{x}_n[k]$ may include a respective stream of digital samples.

Element combiner 730 may include multiple element combiners, where each element combiner may be coupled with a respective subset of the ADCs and receive a corresponding set of digital sample streams. The element combiners may each process a respective set of digital sample streams received from a respective subset of the ADCs. For example, a first element combiner may convert a respective set of digital sample streams (which may be represented as $\bar{x}=(\bar{x}_0, \bar{x}_1, \ldots, \bar{x}_J)$, where J may be less than N) received from a respective subset of the ADCs into a first subarray signal, $y_A$, that corresponds to first signal 720-a and a second subarray signal, $y_B$, that corresponds to second signal 720-b. The element combiner may also buffer a subset of the digital samples included in each of the respective set of digital sample streams, where the buffered subset of the digital samples may be represented as $\bar{x}'=(\bar{x}_0', \bar{x}_1', \ldots, \bar{x}_J')$.

In some examples, the element combiners may combine the self-generated subarray signals with subarray signals generated by an adjacent element combiner e.g., when receiving device 703 is configured in a daisy-chain configuration and subarray combiner 735 is not included in receiving device 703. In such cases, second data intermediary interface 750-b and main data interface 765 may be the same interface, and element combiner 730 may communicate the combined subarray signals as a set of resulting beam signals $y_A'$ and $y_B'$ via main data interface 765 to processor 780. In some examples, element combiner 730 may also communicate time-synchronized buffered subsets of the digital samples to processor 780 via main data interface 765—e.g., with the beam signals in an interleaved fashion. In other examples, element combiner 730 may communicate the time-synchronized subsets of the digital samples to processor 780 via control interface 755.

When receiving device 703 includes subarray combiner 735, the element combiners in element combiner 730 may transmit respective subarray signals to subarray combiner 735 via second data intermediary interface 750-b—e.g., when receiving device 703 is configured in a corporate-feed configuration. The respective subarray signals may be represented as $\bar{y}_A = (\bar{y}_{A0}, \bar{y}_{A1}, \ldots, \bar{y}_{AL})$ and $y_B = (\bar{y}_{B0}, \bar{y}_{B1}, \ldots, \bar{y}_{BL})$, where L may be equivalent to the quantity of element combiners in element combiner 730. The element combiners may also transmit respective buffered subsets of the digital samples to subarray combiner 735 (where the subsets of digital samples may be represented as $\bar{x}' = (\bar{x}_0', \bar{x}_1', \ldots, \bar{x}_N'))$. In other examples, the element combiners may transmit the subarray signals to subarray combiner 735 via second data intermediary interface 750-b and the subsets of the digital samples to processor 780 via control interface 755.

Subarray combiner 735 may process the information received from element combiner 730. In some examples, subarray combiner 735 may combine multiple sets of subarray signals $(\bar{y}_{A0}, \bar{y}_{A1}, \ldots, \bar{y}_{AL})$ received from the element combiners in element combiner 730 to obtain a set of resulting beam signals $y_A'$ and $y_B'$. Subarray combiner 735 may also collate the buffered subsets of digital samples received from the element combiners. Subarray combiner 735 may transmit the resulting beam signals via main data interface 765 to processor 780. In some examples, subarray combiner 735 may also transmit the buffered subsets of the digital samples via main data interface 765—e.g., with the resulting beam signals in an interleaved fashion. In other examples, subarray combiner 735 may transmit the subsets of the digital samples via control interface 755 to processor 780.

In some examples, timing component 760 and/or control/status component 770 may provide signals to the components within receiving device 703 that support the storage and communication of the subsets of the digital samples throughout receiving device 703. In some examples, timing component 760 and/or control/status component 770 send (periodically or aperiodically) timing signals that cause signal converter 715 or element combiner 730 to buffer samples of the continuous digital sample streams for a duration. After storing the subsets of the digital sample streams, a stream processing component at signal converter 715 may perform operations that cause the subsets of the digital sample streams to be transmitted—e.g., via first data intermediary interface 750-a to element combiner 730 or via control interface 755 to processor 780. In other examples, if the subsets of the digital sample streams are buffered at element combiner 730, a stream processing component at element combiner 730 may perform operations that cause the subsets of the digital sample streams to be transmitted—e.g., via second data intermediary interface 750-b to subarray combiner 735 or via control interface 755 to processor 780.

Figure 8:
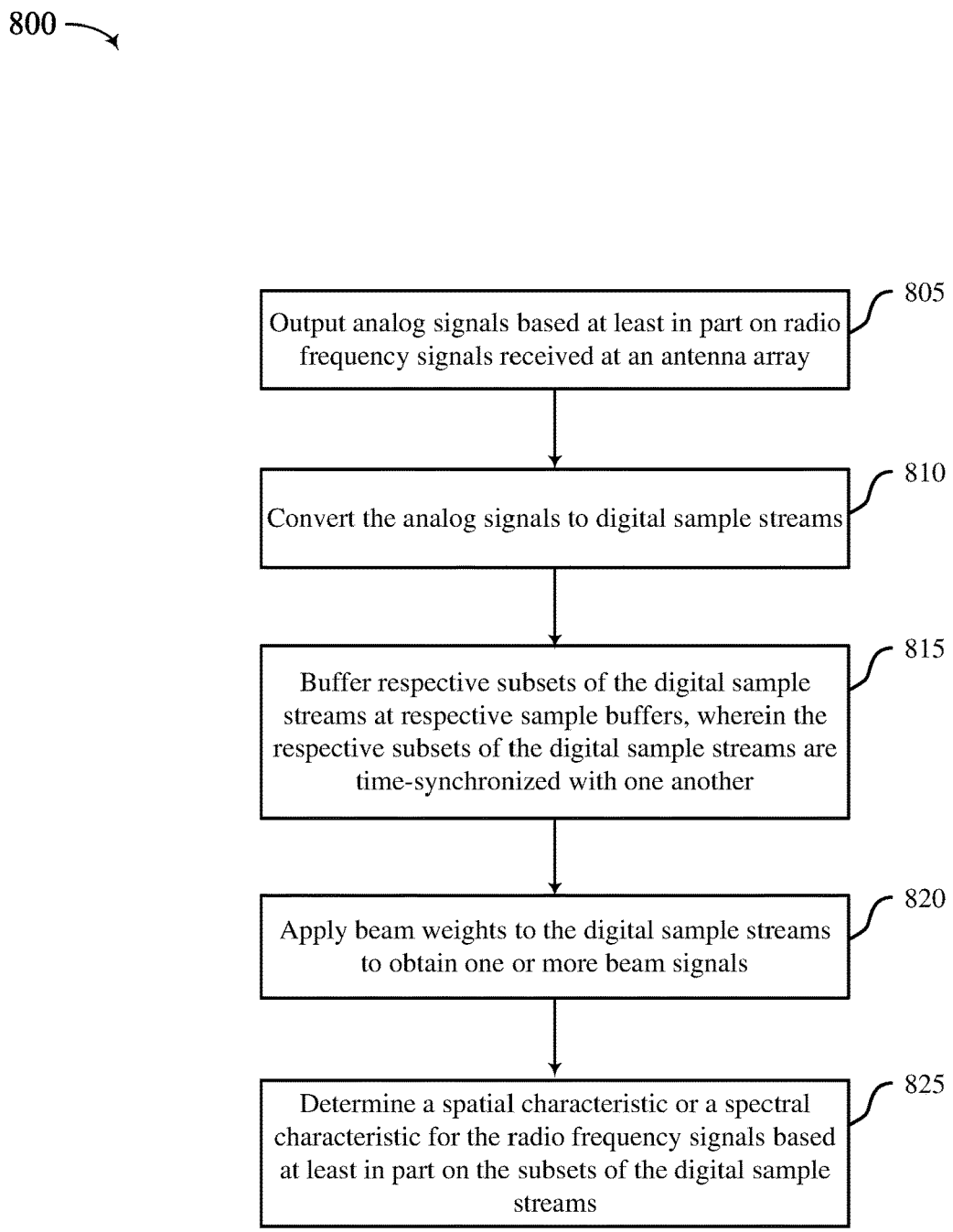
FIG. 8 shows a diagram of a process for simultaneous beamforming and surveying modes in accordance with examples as disclosed herein.

FIG. 8 shows a diagram of a process for simultaneous beamforming and surveying modes in accordance with examples as disclosed herein. The operation of method 800 may be implemented by an access node terminal, satellite, user terminal, RF receiver, or its components as described herein. In some examples, a processing system in the access node terminal and/or satellite may execute a set of instructions to control the functional elements of the satellite to perform the described functions. In some examples, the processing system provides functions such as communication, identification, surveillance, or radar. Additionally, or alternatively, the processing system may perform aspects of the described functions using special-purpose hardware. In some examples, the processing system is a receiving device as described herein with reference to FIGS. 2-3 and may perform the method 800.

At 805, analog signals may be output based on radio frequency signals received at an antenna array. The operations of 805 may be performed according to the techniques described herein. In some examples, aspects of the operations of 805 may be performed by an antenna array (e.g., using one of the antenna arrays described in FIGS. 2 through 7) as described herein.

At 810, the analog signals may be converted into digital sample streams. The operations of 810 may be performed according to the techniques described herein. In some examples, aspects of the operations of 810 may be performed by an analog-to-digital signal converter (e.g., using one of the signal converters described in FIGS. 2 through 7) as described herein.

At 815, respective subsets of the digital sample streams may be buffered at respective sample buffers, where the respective subsets of the digital sample streams may be time-synchronized with one another. The operations of 815 may be performed according to the techniques described herein. In some examples, aspects of the operations of 815 may be performed by sample buffer (e.g., first element sample buffer 235-a of FIG. 2) as described herein. In some examples, instead of buffering the subsets of the digital sample streams, the subsets of the digital sample streams may be immediately forwarded (e.g., to a stream processor or main processor).

At 820, beam weights may be applied to the digital sample streams to obtain one or more beam signals. The operations of 820 may be performed according to the techniques described herein. In some examples, aspects of the operations of 820 may be performed by a beamformer (e.g., first element beamformer 240-a or subarray beamformer 340 of FIGS. 2 and 3) as described herein.

At 825, a spatial characteristic, a spectral characteristic, or both may be determined for the radio frequency signals based on the subsets of the digital sample streams. The operations of 825 may be performed according to the techniques described herein. In some examples, aspects of the operations of 825 may be performed by a processor (e.g., using one of the processors described in FIGS. 2 through 7) as described herein. In some examples, aspects of operations of 825 may be implemented in hardware that is in parallel or in series with the hardware implementing operations of 820.

It should be noted that the methods described herein are possible implementations, and that the operations and the steps may be rearranged or otherwise modified and that other implementations are possible. Furthermore, portions from two or more of the methods may be combined.

An apparatus for communications is described. The apparatus may include an antenna array configured to receive radio frequency signals and output analog signals based on the radio frequency signals, analog-to-digital signal converters coupled with the antenna array and configured to convert the analog signals to digital sample streams, a sample buffer coupled with the analog-to-digital signal converters and configured to buffer respective subsets of the digital sample streams, where the respective subsets of the digital sample streams are time-synchronized with one another, a beamformer coupled with the analog-to-digital signal converters and configured to apply beam weights to the digital sample streams to obtain one or more beam signals, and a processor coupled with the sample buffer, the processor configured to determine a spatial characteristic or a spectral characteristic for the radio frequency signals based on the subsets of the digital sample streams.

In some examples, the processor may be configured to adjust the beam weights applied by the beamformer based on the spatial characteristic.

In some examples, the processor may be configured to adjust determine respective offsets for one or more antenna elements for calibration of the antenna array, where adjusting the beam weights applied by the beamformer may be based on the respective offsets determined for the one or more antenna elements.

In some examples, the beam weights are associated with a first direction for a beam for communication with a target device, and the processor may be configured to determine a second direction for the beam for communication with the target device based on the spatial characteristic, where adjusting the beam weights applied by the beamformer may be based on the second direction for the beam.

In some examples, the processor may be configured to adjust filters associated with the one or more beam signals based on the spectral characteristics.

In some examples, the sample buffer includes a set of element sample buffers, each element sample buffer configured to buffer a subset of a digital sample stream associated with one or more antenna elements of the antenna array, and the beamformer includes a set of element beamformers, each element beamformer configured to apply one or more beam weights to one or more of the digital sample streams to obtain subarray signals.

In some examples, the apparatus include a set of element combiners coupled with the analog-to-digital signal converters and including: respective element beamformers of the set of element beamformers configured to apply one or more beam weights to respective digital sample streams output by respective subsets of the analog-to-digital signal converters to obtain respective subarray signals, and respective element sample buffers of the set of element sample buffers configured to buffer respective subsets of respective digital sample streams output by respective subsets of the analog-to-digital signal converters.

In some examples, the set of element combiners may be configured to collate a subset of digital sample streams buffered at a respective element combiner with additional subsets of digital sample streams received in a subarray packet stream from an adjacent element combiner to obtain collated subsets of digital sample streams.

In some examples, the respective element stream processors may be configured to combine one or more subarray signals generated by a respective element beamformer with additional subarray signals received in the subarray packet stream to obtain the one or more beam signals, and packetize the one or more beam signals and the collated subsets of digital sample streams to obtain a combined packet stream.

In some examples, the processor may be configured to receive the combined packet stream from an element combiner of the set of element combiners, obtain data streams based on the one or more beam signals in the combined packet stream, and determine the spatial characteristic or the spectral characteristic based on the collated subsets of digital sample streams in the combined packet stream.

In some examples, the beamformer includes one or more subarray beamformers configured to combine the subarray signals generated by the respective element beamformers to obtain the one or more beam signals, and the apparatus further includes one or more subarray combiners coupled with the set of element combiners and including respective subarray beamformers of the one or more subarray beamformers configured to combine the subarray signals to obtain the one or more beam signals.

In some examples, the set of element combiners include respective element stream processors configured to packetize the subarray signals generated by the respective element beamformers and subsets of digital sample streams buffered by the respective element sample buffers to obtain respective subarray packet streams, and the one or more subarray combiners include respective subarray stream processors configured to: receive the respective subarray packet streams from respective element combiners of the set of element combiners, collate, based on the respective subarray packet streams, the subsets of digital sample streams received from the respective element combiners to obtain collated subsets of digital sample streams, and packetize the one or more beam signals and the collated subsets of digital sample streams to obtain a combined packet stream.

In some examples, the processor is configured to receive respective combined packet streams from the one or more subarray combiners, obtain data streams based on the one or more beam signals in the respective combined packet streams, and determine the spatial characteristic or the spectral characteristic based on the collated subsets of the digital sample streams in the respective combined packet streams.

In some examples, the processor is configured to apply beam weights to the digital sample streams to obtain weighted digital sample streams, and combine the weighted digital sample streams to obtain the one or more beam signals.

In some examples, the apparatus includes a stream processor coupled with the beamformer and the sample buffer and configured to: interleave the one or more beam signals and the subsets of the digital sample streams; and transmit the interleaved one or more beam signals and subsets of the digital sample streams via a communications interface.

Some examples of the apparatus may include a demodulator configured to receive the one or more beam signals via a communications interface, the demodulator further configured to demodulate the one or more beam signals to obtain one or more data streams, and where the processor may be further configured to store the subsets of the digital sample streams and determine the spatial characteristic or the spectral characteristic for the radio frequency signals based on an analysis of the stored subsets of the digital sample streams.

In some examples, the sample buffer is configured to receive timing signals associated with capturing the subsets of the digital sample streams, and buffer the subsets of the digital sample streams based on the timing signals.

Some examples of the apparatus may include a set of antenna arrays that includes the antenna array and a second antenna array configured to output second analog signals, second analog-to-digital signal converters coupled with the second antenna array and configured to convert the second analog signals to second digital sample streams, a second sample buffer coupled with the second analog-to-digital signal converters and configured to buffer respective subsets of the second digital sample streams, where the respective subsets of the second digital sample streams may be time-synchronized with one another, a second beamformer coupled with the second analog-to-digital signal converters and configured to apply second beam weights to the second digital sample streams to obtain one or more second beam signals, and an array combiner coupled with the beamformer and the second beamformer and configured to combine the one or more beam signals and the one or more second beam signals to obtain the one or more beam signals.

In some examples, the array combiner may be configured to collate the subsets of the digital sample streams and the subsets of the second digital sample streams to obtain collated subsets of the digital sample streams, and the processor may be configured to determine the spatial characteristic or the spectral characteristic based on the collated subsets of the digital sample streams.

Some examples of the apparatus may include a stream processor configured to packetize a subset of the digital sample streams in a first packet and a synchronously captured subset of the second digital sample streams in a second packet, where a length of the first packet may be based on a propagation delay of signals from the set of antenna arrays to the array combiner, and where the array combiner may be further configured to align a beginning of the first packet with a beginning of the second packet.

In some examples, each of the digital sample streams may be associated with one or more respective antenna elements of an antenna subarray of the antenna array.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA, or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may include random-access memory (RAM), read-only memory (ROM), electrically erasable programmable read-only memory (EEPROM), flash memory, compact disk read-only memory (CDROM) or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:
1. An apparatus for communications, comprising:
   an antenna array configured to receive, during a duration, radio frequency signals and output analog signals based at least in part on the radio frequency signals;

analog-to-digital signal converters coupled with the antenna array and configured to convert the analog signals to digital sample streams extending across the duration;

a sample buffer coupled with the analog-to-digital signal converters and configured to buffer respective subsets of the digital sample streams extending across respective intervals of the duration, wherein the respective intervals are shorter in time than the duration, wherein the respective subsets of the digital sample streams are time-synchronized with one another, and wherein the sample buffer comprises a plurality of element sample buffers, each element sample buffer configured to buffer a respective subset of a digital sample stream associated with one or more antenna elements of the antenna array;

a beamformer coupled with the analog-to-digital signal converters and configured to apply, during the duration, beam weights to the digital sample streams to obtain one or more beam signals that extend across the duration, wherein the beamformer comprises a plurality of element beamformers, each element beamformer configured to apply one or more beam weights to one or more of the digital sample streams to obtain subarray signals that extend across the duration; and a processor coupled with the sample buffer, the processor configured to determine a spatial characteristic for the radio frequency signals based at least in part on the subsets of the digital sample streams.

2. The apparatus of claim 1, wherein the processor is further configured to:
adjust the beam weights applied by the beamformer based at least in part on the spatial characteristic.

3. The apparatus of claim 2, wherein the processor is further configured to:
determine respective offsets for one or more antenna elements for calibration of the antenna array, wherein adjusting the beam weights applied by the beamformer is based at least in part on the respective offsets determined for the one or more antenna elements.

4. The apparatus of claim 2, wherein the beam weights are associated with a first direction for a beam for communication with a target device, and wherein the processor is further configured to:
determine a second direction for the beam for communication with the target device based at least in part on the spatial characteristic, wherein adjusting the beam weights applied by the beamformer is based at least in part on the second direction for the beam.

5. The apparatus of claim 1, wherein the processor is further configured to:
determine a spectral characteristic based at least in part on the subsets of the digital sample streams; and
adjust filters associated with the one or more beam signals based at least in part on the spectral characteristic.

6. The apparatus of claim 1, further comprising:
a plurality of element combiners coupled with the analog-to-digital signal converters and comprising:
respective element beamformers of the plurality of element beamformers configured to apply one or more beam weights to respective digital sample streams output by respective subsets of the analog-to-digital signal converters to obtain respective subarray signals, and
respective element sample buffers of the plurality of element sample buffers configured to buffer respective subsets of respective digital sample streams output by respective subsets of the analog-to-digital signal converters.

7. The apparatus of claim 6, wherein the plurality of element combiners comprises respective element stream processors configured to:
collate a subset of digital sample streams buffered at a respective element combiner with additional subsets of digital sample streams received in a subarray packet stream from an adjacent element combiner to obtain collated subsets of digital sample streams.

8. The apparatus of claim 7, wherein the respective element stream processors are further configured to:
combine one or more subarray signals generated by a respective element beamformer with additional subarray signals received in the subarray packet stream to obtain the one or more beam signals, and
packetize the one or more beam signals and the collated subsets of digital sample streams to obtain a combined packet stream.

9. The apparatus of claim 8, wherein the processor is configured to:
receive the combined packet stream from an element combiner of the plurality of element combiners;
obtain data streams based at least in part on the one or more beam signals in the combined packet stream; and
determine the spatial characteristic based at least in part on the collated subsets of digital sample streams in the combined packet stream.

10. The apparatus of claim 6, wherein:
the beamformer comprises one or more subarray beamformers configured to combine the subarray signals generated by the respective element beamformers to obtain the one or more beam signals, and
the apparatus further comprises one or more subarray combiners coupled with the plurality of element combiners and comprising respective subarray beamformers of the one or more subarray beamformers configured to combine the subarray signals to obtain the one or more beam signals.

11. The apparatus of claim 10, wherein:
the plurality of element combiners comprise respective element stream processors configured to packetize the subarray signals generated by the respective element beamformers and subsets of digital sample streams buffered by the respective element sample buffers to obtain respective subarray packet streams, and
the one or more subarray combiners comprise respective subarray stream processors configured to:
receive the respective subarray packet streams from respective element combiners of the plurality of element combiners,
collate, based at least in part on the respective subarray packet streams, the subsets of digital sample streams received from the respective element combiners to obtain collated subsets of digital sample streams, and
packetize the one or more beam signals and the collated subsets of digital sample streams to obtain a combined packet stream.

12. The apparatus of claim 11, wherein the processor is configured to:
receive respective combined packet streams from the one or more subarray combiners;
obtain data streams based at least in part on the one or more beam signals in the respective combined packet streams; and determine the spatial characteristic based at least in part on the collated subsets of digital sample streams in the respective combined packet streams.

13. The apparatus of claim 1, wherein weighted digital sample streams are obtained based at least in part on applying the beam weights to the digital sample streams, and wherein the beamformer is further configured to:
combine the weighted digital sample streams to obtain the one or more beam signals.

14. The apparatus of claim 1, further comprising:
a stream processor coupled with the beamformer and the sample buffer and configured to:
interleave the one or more beam signals and the subsets of the digital sample streams; and
transmit, to the processor, the interleaved one or more beam signals and subsets of the digital sample streams via a communications interface.

15. The apparatus of claim 1, further comprising:
a demodulator configured to receive the one or more beam signals via a communications interface, the demodulator further configured to demodulate the one or more beam signals to obtain one or more data streams,
wherein the processor is further configured to store the subsets of the digital sample streams and determine the spatial characteristic for the radio frequency signals based at least in part on an analysis of the stored subsets of the digital sample streams.

16. The apparatus of claim 1, wherein the sample buffer is further configured to:
receive timing signals associated with capturing the subsets of the digital sample streams; and
buffer the subsets of the digital sample streams based at least in part on the timing signals.

17. The apparatus of claim 1, further comprising:
a plurality of antenna arrays that comprises the antenna array and a second antenna array configured to output second analog signals;
second analog-to-digital signal converters coupled with the second antenna array and configured to convert the second analog signals to second digital sample streams;
a second sample buffer coupled with the second analog-to-digital signal converters and configured to buffer respective subsets of the second digital sample streams, wherein the respective subsets of the second digital sample streams are time-synchronized with one another;
a second beamformer coupled with the second analog-to-digital signal converters and configured to apply second beam weights to the second digital sample streams to obtain one or more second beam signals; and
an array combiner coupled with the beamformer and the second beamformer and configured to combine the one or more beam signals and the one or more second beam signals to obtain the one or more beam signals.

18. The apparatus of claim 17, wherein:
the array combiner is configured to collate the subsets of the digital sample streams and the subsets of the second digital sample streams to obtain collated subsets of the digital sample streams, and
the processor is configured to determine the spatial characteristic based at least in part on the collated subsets of the digital sample streams.

19. The apparatus of claim 17, further comprising:
a stream processor configured to packetize a subset of the digital sample streams in a first packet and a synchronously captured subset of the second digital sample streams in a second packet,
wherein a length of the first packet is based at least in part on a propagation delay of signals from the plurality of antenna arrays to the array combiner, and
wherein the array combiner is further configured to align a beginning of the first packet with a beginning of the second packet.

20. The apparatus of claim 1, wherein each of the digital sample streams is associated with one or more respective antenna elements of an antenna subarray of the antenna array.

21. The apparatus of claim 1, wherein the processor is further configured to:
determine a spectral characteristic for the radio frequency signals based at least in part on the subsets of the digital sample streams.

22. The apparatus of claim 21, wherein:
the spatial characteristic comprises a direction of one or more devices from which the radio frequency signals are transmitted, respective angles of arrival of the radio frequency signals, or both, and
the spectral characteristic comprises respective carrier frequencies of the radio frequency signals, respective frequency ranges used by the radio frequency signals, or both.

23. A method for communications, comprising:
outputting, at an antenna array, analog signals based at least in part on radio frequency signals received during a duration;
converting the analog signals to digital sample streams extending across the duration;
buffering, at a sample buffer, respective subsets of the digital sample streams extending across respective intervals of the duration, wherein the respective intervals are shorter in time than the duration, wherein the respective subsets of the digital sample streams are time-synchronized with one another;
applying beam weights to the digital sample streams to obtain one or more beam signals;
interleaving, by a stream processor, the one or more beam signals and the subset of the digital sample streams;
transmitting, by the stream processor to a processor, the interleaved one or more beam signals and subsets of the digital sample streams via a communications interface; and
determining, by the processor, a spatial characteristic for the radio frequency signals based at least in part on the subsets of the digital sample streams.

24. The method of claim 23, further comprising:
adjusting the beam weights based at least in part on the spatial characteristic.

25. The method of claim 24, further comprising:
determining respective offsets for one or more antenna elements for calibration of the antenna array, wherein the beam weights are adjusted based at least in part on the respective offsets determined for the one or more antenna elements.

26. The method of claim 24, wherein the beam weights are associated with a first direction for a beam for communication with a target device, the method further comprising:
determining a second direction for the beam for communication with the target device based at least in part on the spatial characteristic, wherein the beam weights are adjusted based at least in part on the second direction for the beam.

27. The method of claim 23, further comprising:
determining a spectral characteristic based at least in part on the subsets of the digital sample streams; and adjusting filters associated with the one or more beam signals based at least in part on the spectral characteristic.

28. The method of claim 23, further comprising:
storing respective subsets of respective digital sample streams associated with one or more respective antenna elements of the antenna array; and
applying one or more beam weights to the respective digital sample streams to obtain respective subarray signals.

29. The method of claim 28, further comprising:
collating a subset of the digital sample streams to obtain collated subsets of the digital sample streams;
combining one or more subarray signals to obtain the one or more beam signals; and
packetizing the one or more beam signals and the collated subsets of the digital sample streams to obtain a combined packet stream.

30. The method of claim 29, further comprising:
determining the spatial characteristic based at least in part on the collated subsets of the digital sample streams in the combined packet stream.

31. An apparatus for communications, comprising:
an antenna array configured to receive, during a duration, radio frequency signals and output analog signals based at least in part on the radio frequency signals;
analog-to-digital signal converters coupled with the antenna array and configured to convert the analog signals to digital sample streams extending across the duration;
a sample buffer coupled with the analog-to-digital signal converters and configured to buffer respective subsets of the digital sample streams extending across respective intervals of the duration, wherein the respective intervals are shorter in time than the duration, wherein the respective subsets of the digital sample streams are time-synchronized with one another;
a beamformer coupled with the analog-to-digital signal converters and configured to apply, during the duration, beam weights to the digital sample streams to obtain one or more beam signals that extend across the duration;
a stream processor coupled with the beamformer and the sample buffer and configured to interleave the one or more beam signals and the subsets of the digital sample streams and to transmit the interleaved one or more beam signals and subsets of the digital sample streams via a communications interface; and
a processor coupled with the stream processor, the processor configured to receive the interleaved one or more beam signals and subsets of the digital sample streams via the communications interface and to determine a spatial characteristic for the radio frequency signals based at least in part on the subsets of the digital sample streams.

* * * * *